(12) United States Patent
Yamazaki et al.

(10) Patent No.: US 7,495,256 B2
(45) Date of Patent: Feb. 24, 2009

(54) SEMICONDUCTOR APPARATUS AND FABRICATION METHOD OF THE SAME

(75) Inventors: Shunpei Yamazaki, Tokyo (JP); Toru Takayama, Kanagawa (JP); Junya Maruyama, Kanagawa (JP); Yumiko Ohno, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 413 days.

(21) Appl. No.: 11/206,000

(22) Filed: Aug. 18, 2005

(65) Prior Publication Data

US 2006/0186399 A1 Aug. 24, 2006

Related U.S. Application Data

(62) Division of application No. 10/685,398, filed on Oct. 16, 2003, now Pat. No. 7,067,392.

(30) Foreign Application Priority Data

Oct. 18, 2002 (JP) ............................... 2002-305084

(51) Int. Cl.
 *H01L 29/04* (2006.01)
 *H01L 31/036* (2006.01)
 *H01L 31/0376* (2006.01)
 *H01L 31/20* (2006.01)

(52) U.S. Cl. ............................. 257/57; 257/59; 257/66; 257/72

(58) Field of Classification Search .................. 257/57, 257/59, 66, 72
See application file for complete search history.

(56) References Cited

U.S. PATENT DOCUMENTS

| 5,519,936 A | 5/1996 | Andros et al. |
| 5,561,323 A | 10/1996 | Andros et al. |
| 5,633,533 A | 5/1997 | Andros et al. |
| 5,757,456 A | 5/1998 | Yamazaki et al. |
| 5,773,884 A | 6/1998 | Andros et al. |

(Continued)

FOREIGN PATENT DOCUMENTS

CN 1180856 A 5/1998

(Continued)

OTHER PUBLICATIONS

International Search Report (Application No. PCT/JP03/13068) dated Jan. 27, 2004; 4 pages.

(Continued)

*Primary Examiner*—Luan C Thai
(74) *Attorney, Agent, or Firm*—Fish & Richardson P.C.

(57) ABSTRACT

It is an object of the present invention to provide a semiconductor device capable of preventing deterioration due to penetration of moisture or oxygen, for example, a light-emitting apparatus having an organic light-emitting device that is formed over a plastic substrate, and a liquid crystal display apparatus using a plastic substrate. According to the present invention, devices formed on a glass substrate or a quartz substrate (a TFT, a light-emitting device having an organic compound, a liquid crystal device, a memory device, a thin-film diode, a pin-junction silicon photoelectric converter, a silicon resistance element, or the like) are separated from the substrate, and transferred to a plastic substrate having high thermal conductivity.

21 Claims, 12 Drawing Sheets

U.S. PATENT DOCUMENTS

| | | |
|---|---|---|
| 5,821,138 A | 10/1998 | Yamazaki et al. |
| 5,825,625 A | 10/1998 | Esterberg et al. |
| 5,834,327 A | 11/1998 | Yamazaki et al. |
| 6,228,965 B1 | 5/2001 | Muta et al. |
| 6,372,608 B1 | 4/2002 | Shimoda et al. |
| 6,376,333 B1 | 4/2002 | Yamazaki et al. |
| 6,689,492 B1 * | 2/2004 | Yamazaki et al. ........... 428/690 |
| 6,781,152 B2 * | 8/2004 | Yamazaki .................... 257/59 |
| 6,828,727 B2 | 12/2004 | Yamazaki |
| 2003/0025118 A1 | 2/2003 | Yamazaki et al. |
| 2003/0032210 A1 | 2/2003 | Takayama et al. |
| 2003/0047280 A1 | 3/2003 | Takayama et al. |
| 2003/0064569 A1 | 4/2003 | Takayama et al. |
| 2003/0082889 A1 | 5/2003 | Maruyama et al. |
| 2003/0134488 A1 | 7/2003 | Yamazaki et al. |
| 2003/0217805 A1 | 11/2003 | Takayama et al. |
| 2004/0087110 A1 | 5/2004 | Takayama et al. |
| 2004/0169786 A1 | 9/2004 | Yamazaki et al. |
| 2004/0238827 A1 | 12/2004 | Takayama et al. |
| 2005/0093436 A1 | 5/2005 | Yamazaki |
| 2005/0164470 A1 | 7/2005 | Yamazaki et al. |

FOREIGN PATENT DOCUMENTS

| | | |
|---|---|---|
| CN | 1 215 920 | 5/1999 |
| CN | 1 245 521 | 2/2000 |
| CN | 1 353 464 | 6/2002 |
| EP | 0 836 227 A2 | 4/1998 |
| EP | 0 942 059 | 9/1999 |
| JP | 2001-331120 | 11/2001 |
| JP | 2003-204049 | 7/2003 |

OTHER PUBLICATIONS

People's Republic of China Office Action (Application No. 200380101620.4), dated Dec. 22, 2006, 20 pages including full English translation.

Office Action (Chinese Application No. 200380101620.4) mailed Sep. 7, 2007; 22 pages with full English language translation.

"Thermally conductive thermoplastics", News about Materials & Application, 2001, vol. 19, No. 3, pp. 27-28. (Full Translation).

Office Action (Application No. 200380101620.4;PCTCN6669) dated Mar. 7, 2008.

* cited by examiner

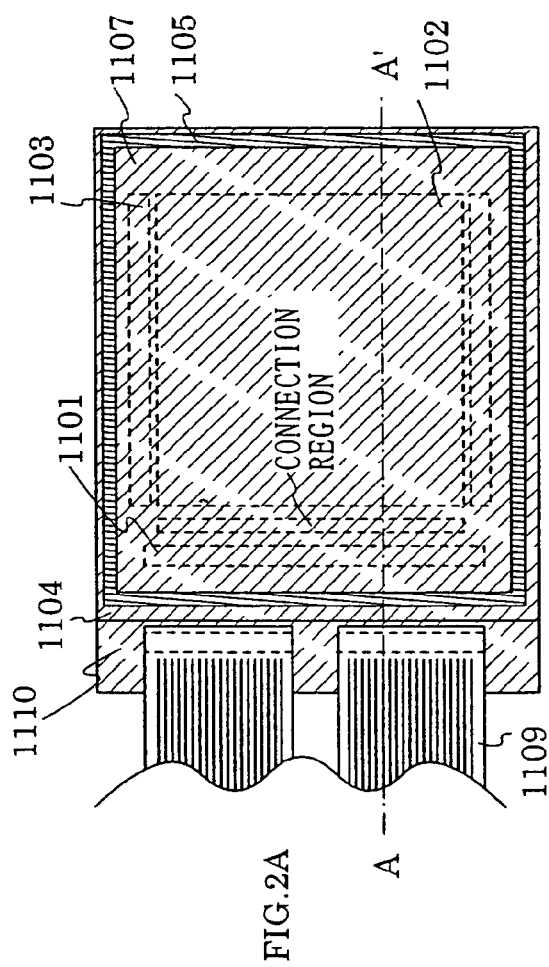
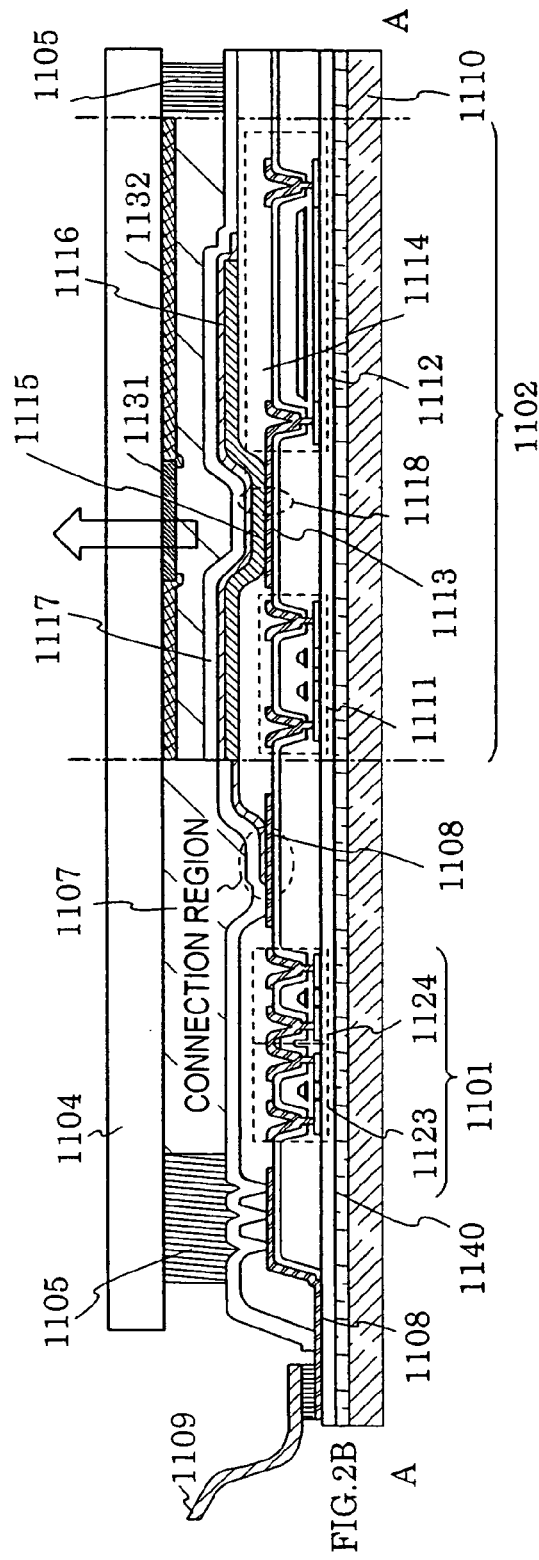
FIG.2A
FIG.2B

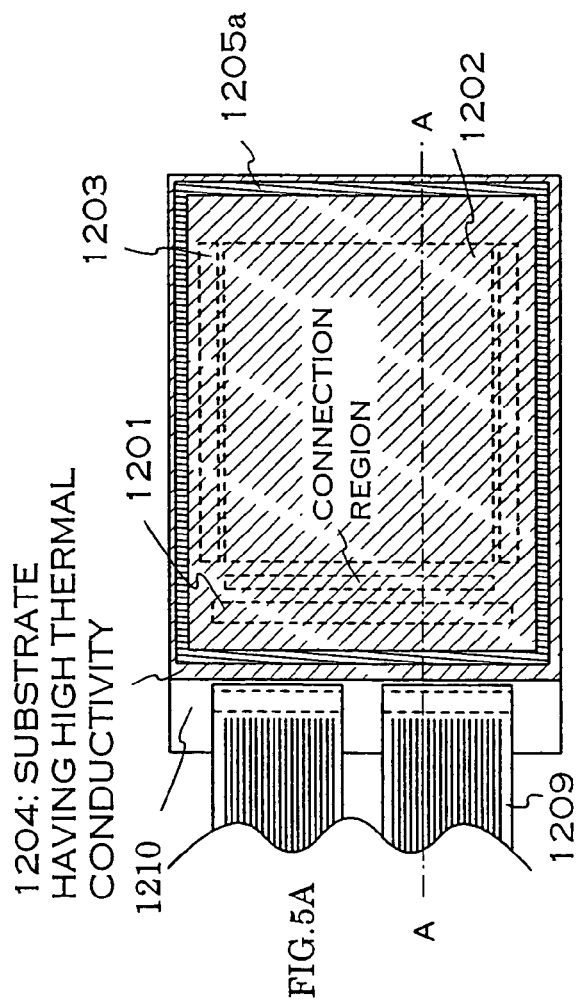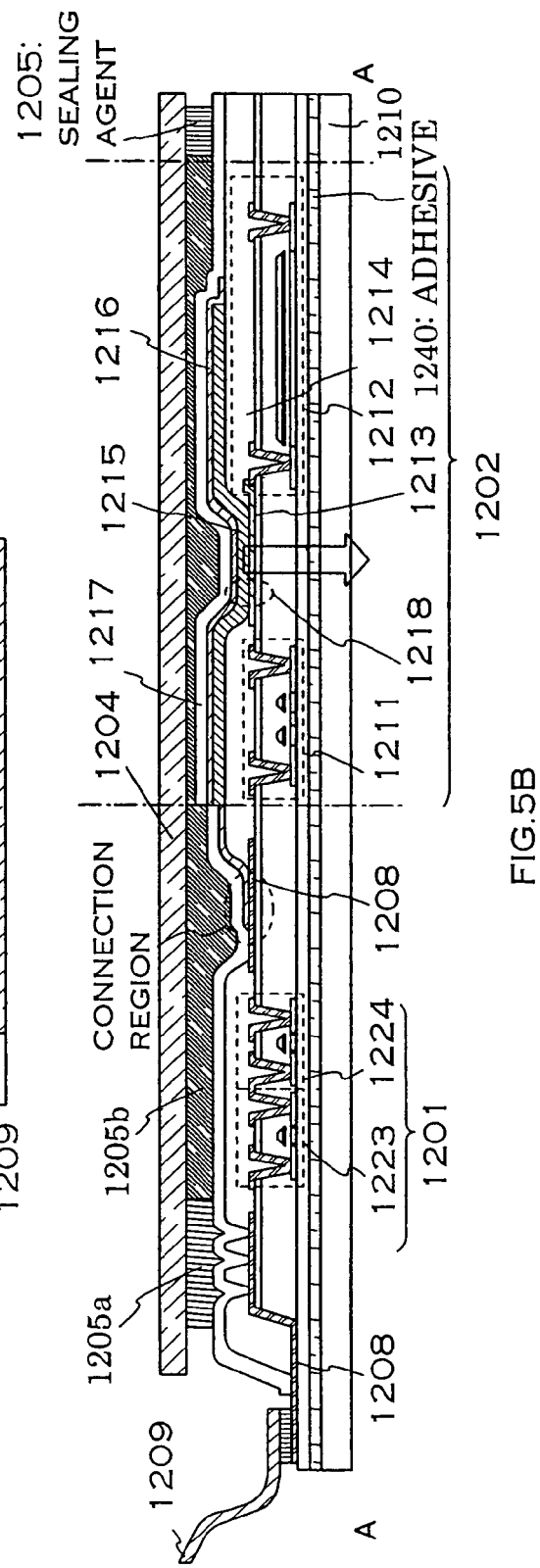
FIG.5A
FIG.5B

SEMICONDUCTOR APPARATUS AND FABRICATION METHOD OF THE SAME

CROSS-REFERENCE TO RELATED APPLICATIONS

This application is a divisional application of U.S. application Ser. No. 10/685,398, filed Oct. 16, 2003, now U.S. Pat. No. 7,067,392 now allowed, which claims the benefit of a foreign priority application filed in Japan as Serial No. 2002-305084 on Oct. 18, 2002. This application claims priority to each of these prior applications, and the disclosures of the prior applications are considered part of (and are incorporated by reference in) the disclosure of this application.

BACKGROUND OF THE INVENTION

1. Technical Field

The present invention relates to a semiconductor apparatus comprising a circuit composed of a device as typified by a thin film transistor (hereinafter, TFT) that is formed by means of bonding a release layer to a substrate to be transferred thereto and a method for manufacturing the semiconductor apparatus. The present invention relates, for example, to an electrooptical device such as a liquid crystal module, a light emitting apparatus such as an EL module, and an electric appliance installed with such apparatus as its components. In addition, the present invention relates to a peeling method of a device and transferring method of the device to a plastic substrate.

As used herein, the term "semiconductor device" refers to any device as a whole that operates by utilizing semiconductor characteristics. An electrooptical device, a light emitting apparatus, a semiconductor circuit, and an electric appliance are all included in the semiconductor device.

2. Background Art

Recently, attention has been paid to technology of composing a thin film transistor (TFT) using a semiconductor thin film (the thickness of about several to several hundreds nm) formed on a substrate having an insulating surface. The thin film transistor is widely applied to electronic devices such as IC, an electrooptical device, or the like. Especially, the development of the thin film transistor as a switching element for an image display apparatus has been quickened.

A variety of applications of such an image display apparatus have been expected, above all, utilization of the image display apparatus for mobile devices draws attention. Although a glass substrate, a quartz substrate, or the like is used in many image display apparatuses at present, it has disadvantages that they are easy to crack and heavy. Further, the glass substrate, the quartz substrate, or the like is unsuitable for mass production since it is difficult to be enlarged. Therefore, a TFT device has been attempted to be formed over a substrate having flexibility as typified by a flexible plastic film.

However, since the heat resistance of the plastic film is low, the highest temperature during process is required to be low, consequently, it is impossible at present to form the TFT that has high electric characteristics compared with the one being formed over a glass substrate. Hence, no high-performance liquid crystal display apparatus and light-emitting device using a plastic film has been realized.

If a light-emitting apparatus or a liquid crystal display device in which organic light-emitting device (OLED) is formed on a flexible substrate such as a plastic film or the like can be manufactured, the light-emitting apparatus or the liquid crystal display apparatus can be manufactured to have a thin thickness and light-weight and applied to a curved surface display, a show window, or the like. Thus, its utilization is not limited to a cellular phone and its application range is extremely wide.

However, in general, a substrate formed of plastic penetrates easily moisture or oxygen. An organic light-emitting layer is deteriorated due to these impurities, so that lifetime of a light-emitting apparatus becomes reduced. Therefore, moisture or oxygen is prevented from penetrating into the organic light-emitting layer by interposing an insulating film such as a silicon nitride, silicon oxynitride, or the like between the plastic substrate and an organic light-emitting device conventionally.

In addition, a substrate such as plastic films or the like is weak against heat generally. In case of increasing the deposition temperature for an insulating film such as silicon nitride, silicon nitroxide, or the like, a substrate becomes easily deformed. Further, too low deposition temperature causes decline in quality of the film and difficulty of preventing penetration of moisture or oxygen into a light-emitting device. There is also a problem of deforming and deterioration of a part of a substrate due to localized heat generation during driving of the device that is formed over a substrate such as plastic films or the like.

DISCLOSURE OF INVENTION

In view of the foregoing, it is an object of the present invention to provide a semiconductor apparatus capable of preventing deterioration due to penetration of moisture or oxygen, for example, a light-emitting apparatus having an organic light-emitting device that is formed over a plastic substrate, and a liquid crystal display apparatus using a plastic substrate.

According to the present invention, devices formed on a glass substrate or a quartz substrate (a TFT, a light-emitting device containing an organic compound, a liquid crystal device, a memory device, a thin-film diode, a pin-junction silicon photoelectric converter, a silicon resistance element, or the like) are separated from the substrate, and transferred to a plastic substrate having high thermal conductivity. The present invention provides a device of long lifetime by radiating heat generated in the device through the plastic substrate having high thermal conductivity.

A plastic substrate having high thermal conductivity is formed of highly thermal conductive resin which is a mixture of metal powder such as copper, iron, aluminum, or the like; metal fibers; low-melting metals (lead-free solders such as tin, bismuth, and zinc); ceramics such as boron nitride, aluminum boron, magnesium oxide, beryllium oxide, or the like; and synthetic resin composed of polypropylene, polypropylene sulfide, polycarbonate, polyetherimide, polyphenylene sulfide, polyphenylene oxide, polysulfone, or polyphthalamide. A thermal conductivity of the highly thermal conductive resin is ranging from 2 to 30 W/mK.

When ceramics and lead-free solders are mixed into synthetic resin, solder becomes melting by heat generated during injection molding, and cooled down, then hardened, and then, the solder is connected with each other like a network through scattered ceramics particles. Consequently, effects of thermal conductivity can be more increased.

Specified quantity of ceramics and lead-free solders are mixed to the highly thermal conductive resin and pelletized. The resulted pellets may be formed into a plate to obtain a substrate by injection molding process. The substrate is formed to be a plate here, but not exclusively, various shapes of substrate can be formed.

A plastic substrate having high thermal conductivity can achieve thermal conductivity as high as that of metals (titanium, alloy of aluminum, alloy of magnesium, or the like). In addition, the plastic substrate can be made at low-cost and formed into light-weight compared with a metal substrate.

In the case that the transmittance of a plastic substrate having high thermal conductivity is low, the plastic substrate having high thermal conductivity is used for the substrate provided at non-display side since it is necessary that the substrate provided at a display side is transparent to light. Specifically, it is preferable that the plastic substrate having high thermal conductivity be provided at a short distance from a device that generates heat.

The structure disclosed in this specification is that a semiconductor apparatus comprising:

a plastic substrate or a plastic base material each of which has thermal conductivity as a support medium;

an adhesive in contact with the plastic substrate or the plastic base material; and a device over an insulating film in contact with the adhesive.

In the above-described structure, wherein the device is a thin-film transistor, a light-emitting device including a light-emitting layer containing an organic compound, a liquid crystal device, a memory device, a pin-junction silicon photoelectric converter, or a silicon resistance element.

In each above-described structure, the adhesive has thermal conductivity. It is preferable that the adhesive for bonding a plastic substrate having high thermal conductivity have high thermal conductivity and be thick. For example, an adhesive (insulating thermal conductivity adhesive) containing filler or powder composed of silver, nickel, aluminum, aluminum nitride, or the like is useful.

In each above-described structure, wherein each the plastic substrate or the plastic base material has higher thermal conductivity than that of the adhesive. The plastic substrate or the plastic base material each of which has thermal conductivity is formed of a mixture of low-melting metals, ceramics, and synthetic resin composed of polypropylene, polypropylene sulfide, polycarbonate, polyetherimide, polyphenylene sulfide, polyphenylene oxide, polysulfone, or polyphthalamide.

The way of peeling or transferring is not particularly limited. A release layer and a substrate may be separated by following, that is; a separation layer is provided between the release layer and the substrate, and the separation layer is removed with etchant; or a separation layer formed of amorphous silicon (or polysilicon) is provided between the release layer and the substrate, and the separation layer is exposed to laser beam through the substrate to release hydrogen in the amorphous silicon, and then, space is formed in the separation layer. In case of using the laser beam, it is preferable that a device included in a release layer be heated at not more than 410° C. for not releasing hydrogen in the amorphous silicon before peeling process.

In addition to the above-described ways, a stress peel-off method that utilize the membrane stress between two films can be used. According to the peeling-off method, a metal layer, preferably, a metal nitride layer is formed on a substrate, and an oxide layer is formed on the metal nitride layer, then, a device can be formed over the oxide layer, and then, a deposition process and heating treatment at not less than 500° C. can be carried out without generating peeling, consequently, inside layers or boundary faces of the oxide layer can be easily separated by a physical means. In addition, heat treatment or laser irradiation can be carried out before peeling by the physical means in order to facilitating the peeling.

The present invention also provides a novel method for manufacturing a semiconductor apparatus using a peeling method and a transferring method.

In the first structure of the present invention disclosed in this specification, a method for manufacturing a semiconductor apparatus comprises the steps of:

a first process for forming a release layer including a semiconductor device over a first substrate;

a second process for coating an organic resin film that melts with solvent over the release layer;

a third process for bonding a second substrate to the organic resin film with a first two-sided tape to sandwich the release layer and the organic resin film between the first substrate and the second substrate;

a fourth process for bonding a third substrate to the first substrate with a second two-sided tape;

a fifth process for separating the first substrate to which the third substrate is bonded from the release layer by a physical means;

a sixth process for bonding a fourth substrate to the release layer to sandwich the release layer between the second substrate and the fourth substrate;

a seventh process for separating the release layer and the first two-sided tape from the second substrate;

an eighth process for separating the release layer from the first two-sided tape; and a ninth process for removing the organic resin film with solvent.

The organic resin film that melts with solvent is formed on the release layer to protect and flatten the surface of a first electrode (an anode or a cathode for a light-emitting device). Flattening the surface can improve the adhesiveness of the substrate and the release layer. Forming the organic resin film on the release layer can improve the adhesiveness of the substrate and the release layer since irregularities due to wirings is covered by the organic resin film. The adhesiveness of the other side of the release layer and the substrate can also be improved without adverse effects of irregularities due to wirings.

In the second structure of the present invention, a method for manufacturing a semiconductor apparatus comprises the steps of:

a first process for forming a release layer including a semiconductor device over a first substrate;

a second process for coating an organic resin film that melts with solvent over the release layer;

a third process for bonding a second substrate to the organic resin film with a first two-sided tape to sandwich the release layer and the organic resin film between the first substrate and the second substrate;

a fourth process for bonding a third substrate to the first substrate with the second two-sided tape;

a fifth process for separating the first substrate to which the third substrate is bonded from the release layer by a physical means;

a sixth process for bonding a fourth substrate to the release layer to sandwich the release layer between the second substrate and the fourth substrate;

a seventh process for separating the release layer and first two-sided tape from the second substrate;

an eighth process for separating the release layer from the first two-sided tape;

a ninth process for removing the organic resin film with solvent; and a tenth process for bonding a fifth substrate to the release layer with a second adhesive to sandwich the release layer between the fourth substrate and the fifth substrate.

In the third structure of the present invention, a method for manufacturing a semiconductor apparatus comprises the steps of:

a first process for forming a release layer including a TFT on a first substrate;

a second process for coating an organic resin film that melts with solvent on the release layer;

a third process for bonding a second substrate to the organic resin film with a first two-sided tape to sandwich the release layer and the organic resin film between the first substrate and the second substrate;

a fourth process for bonding a third substrate to the first substrate with the second two-sided tape;

a fifth process for separating the first substrate to which the third substrate is bonded from the release layer by a physical means;

a sixth process for bonding a fourth substrate to the release layer with a first adhesive to sandwich the release layer between the second substrate and the fourth substrate;

a seventh process for separating the release layer and the first two-sided tape from the second substrate;

an eighth process for separating the release layer from the first two-sided tape;

a ninth process for removing the organic resin film with solvent;

a tenth process for fabricating a light-emitting device including an organic compound on the release layer; and an eleventh process for bonding a fifth substrate for sealing the light-emitting device to the release layer with a second adhesive to sandwich the release layer between the fourth substrate and the fifth substrate.

Above-described structures relating to each method for manufacturing a semiconductor apparatus, wherein the solvent is water or alcohol.

Above-described structure relating to each method for manufacturing a semiconductor apparatus, wherein adhesiveness of the first two-sided tape and the second substrate in the seventh process is stronger than that of the release layer and the fourth substrate.

It is preferable that a substrate that transfers to the release layer have greater rigidity than that of a substrate that is transferred.

The above-described first and second structures relating to each method for manufacturing a semiconductor apparatus, wherein the first substrate is a glass substrate, the second and the third substrates are a quartz substrate or a metal substrate, and the fourth substrate and the fifth substrate are plastic substrates The above-described first and second structures relating to each method for manufacturing a semiconductor apparatus, wherein a plastic substrate having thermal conductivity can be bonded, the first substrate is a glass substrate, the second and the third substrates are a quartz substrate or a metal substrate, and among the fourth and the fifth substrate, one is a plastic substrate being transparent to light and another is a plastic substrate having thermal conductivity.

Above-described structure relating to each method for manufacturing a semiconductor apparatus, wherein the fourth or the fifth substrate is a plastic substrate on the surface of which a $SiN_x$ film, a $SiN_xO_y$ film, an $AlN_x$ film, or an $AlN_xO_y$ film is formed. The reliability of a semiconductor apparatus can be improved by forming a $SiN_x$ film, a $SiN_xO_y$ film, an $AlN_x$ film, or an $AlN_xO_y$ film over the plastic substrate to give a barrier property.

The process for bonding the second substrate with a two-sided tape and the process of bonding the third substrate may be carried out whichever first. Above-described structure relating to each method for manufacturing a semiconductor apparatus, wherein the order of a third process for bonding the second substrate to the organic resin film with a first two-sided tape to sandwich the release layer and the organic resin film between the first substrate and the second substrate, and a fourth process for bonding a third substrate to the first substrate with a second two-sided tape can be reversed.

As used in this specification, the term "EL layer" refers to any layer provided between a cathode and an anode. Therefore the above-described hole injection layer, hole transporting layer, light-emitting layer, electron transporting layer, and electron injection layer may be all EL layer.

As used in this specification, the term "EL device" refers to a light-emitting device having the structure that an EL material and a layer containing an organic material or inorganic material for injecting carriers to the EL material (hereinafter, an EL layer) are interposed between two electrodes (an anode and a cathode), that is, a diode comprising an anode, cathode, and an EL layer.

BRIEF DESCRIPTION OF DRAWINGS

FIGS. 2A and 2B are views according to Embodiment 2;

FIGS. 5A and 5B are views according to Embodiment 3;

BEST MODE FOR CARRYING OUT THE INVENTION

Embodiment Mode 1

An example of bonding an insulating substrate having high thermal conductivity or a substrate to a release layer (including a device) that is separated by peeling-off method will be described in this embodiment mode.

Figure 1A:
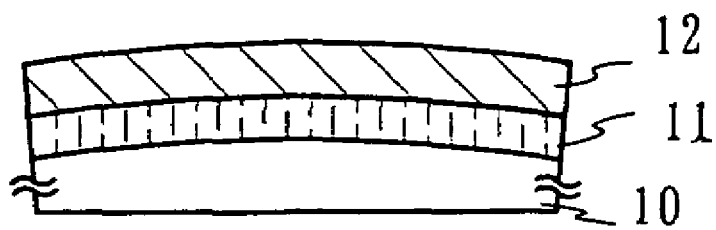
FIGS. 1A to 1D are views according to Embodiment Mode 1.

In FIG. 1A, reference numeral 10 denotes an insulating substrate having thermal conductivity; 11, an adhesive; and 12, a release layer (including a device). The release layer 12 includes a semiconductor device formed on a substrate (not shown) in advance. The release layer 12 is separated from a substrate by a peeled-off method and bonded to the substrate 10 with the adhesive 11.

Specified quantity of powder such as Al, Mg, ceramics, or the like, and powder of a low-melting metal (lead-free solders) are mixed into polyphenylene sulfide or the like as thermoplastic resin, and the mixture is pelletized. The resulted pellets may be formed into the substrate 10 having a curved surface by injection molding process or compression molding process. The low-melting metal becomes melted due to heat by injection molding, and cooled, and then, hardened. In the resulted low-melting metal, fibrous metals are connected with each other like a network through scattered ceramics particles and formed a route for thermal conduction. The resulted substrate 10 has such high thermal conductivity ranging from 5 to 30 W/mK. In addition, as a manufacturing machine for melting and mixing resin composition, general mixing machine for resin, rubber, or ceramics may be utilized. A mixing machine can disperse the powder of resin and low-melting metal each of which has extremely different specified gravity. The melted and mixed resin and low-melting metal in the mixing machine is extracted in the form of lump. The lump of composition is melted again and pelletized to fabricate particulate composition referred to as pellet. The pellet is formed into any shape by injection molding process.

A semiconductor apparatus can be completed by building a device (a TFT, a light-emitting device containing an organic compound, a liquid crystal device, a memory device, a thin film diode, a pin-junction silicon photoelectric converter, a silicon resistance element, or the like) provided with the release layer 12 into the semiconductor apparatus. The semiconductor apparatus can radiate quickly heat generated in the apparatus by the substrate 10 during driving. Moreover, the heat radiation property can be improved by forming the thickness of the adhesive 11 into thin.

Figure 1B:
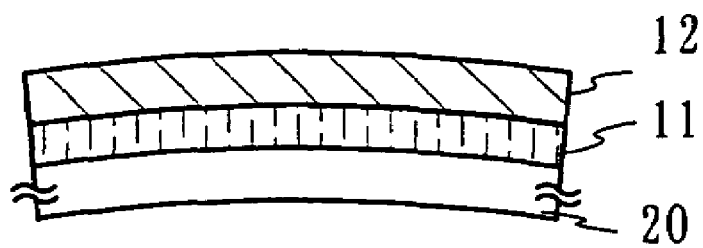

FIG. 1B is a view of an example of using an insulating substrate having thermal conductivity that is molded into a flat sheet. Components in FIG. 1B except a substrate 20 are the same as of FIG. 1A and will not be further explained. Through FIG. 1B, reference numeral 20 denotes an insulating substrate having thermal conductivity; 11, an adhesive; and 12, a release layer (including a device). The release layer 12 is separated from a substrate (not shown) by a peeled-off method and bonded to the substrate 10 with the adhesive 11. The curved substrate 20 is illustrated in a cross-sectional view in FIG. 1B in order to show that the substrate 20 is flexible.

Figure 1C:
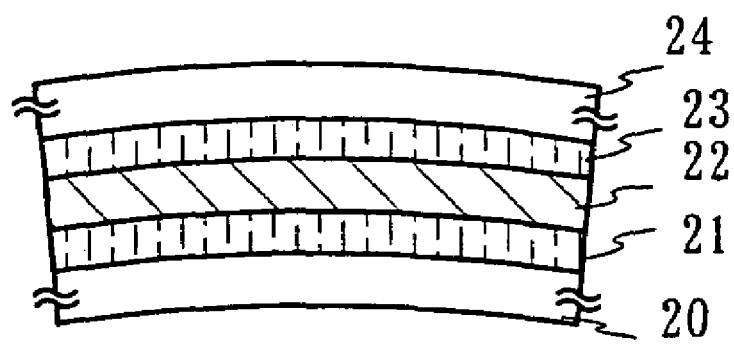

FIG. 1C is a view of an example of interposing a release layer between a pair of substrates 20 and 24. In order that a release layer 22 is protected against impurities dispersion from outside or physical force from outside, the substrate 24 is bonded thereto with an adhesive 23 and sealed the release layer 22. The substrate 24 is a flexible plastic substrate or a thin curved glass substrate. In order to improve barrier property of the substrate, a single layer chosen from the group consisting of a $SiN_x$ film, a $SiN_xO_y$ film, an $AlN_x$ film, or an $AlN_xO_y$ film or a laminate layer of these films can be formed on a surface of the substrate 24.

Through FIG. 1C, reference numeral 20 denotes an insulating base material having thermal conductivity; 21, a first adhesive; 22, a release layer (including a device); 23, a second adhesive; and 24, a substrate. The release layer 22 is separated from a substrate (not shown) by a peeled-off method and bonded to the substrate 20 with the first adhesive 21. Or the substrate 24 is bonded to the release layer 22 with the second adhesive 23, and the release layer is separated therefrom and bonded to the substrate 20 with the first adhesive 21.

Figure 1D:
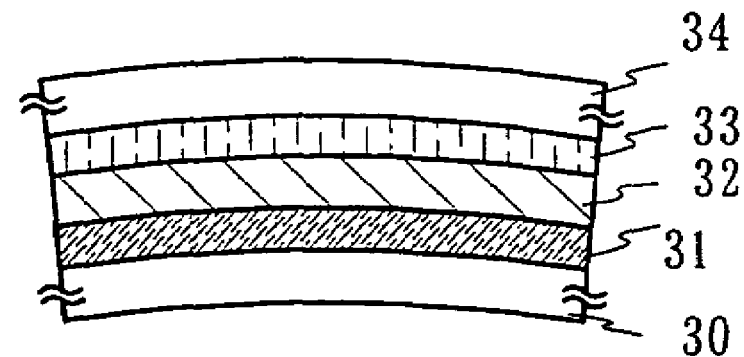

FIG. 1D is a view of an example of interposing a release layer between a pair of substrates 30 and 34 using a material having thermal conductivity as a adhesive 31.

Though FIG. 1D, reference numeral 30 denotes an insulating substrate having thermal conductivity; 31, an adhesive having high thermal conductivity; 32, a release layer (including a device); 33, an adhesive; and 34, a substrate.

As the adhesive having high thermal conductivity 31, filler or powder composed of silver, nickel, aluminum, aluminum nitride, or the like (insulating thermal conductivity adhesive) may be used. The heat radiation property can be improved by using the adhesive having high thermal conductivity 31.

Embodiment Mode 2

An example of manufacturing an active matrix light emitting apparatus will be described with reference to FIG. 3 in this embodiment mode 2.

The present invention can be applied to an active matrix light-emitting apparatus, but not exclusively, any light-emitting device as long as that has a layer containing an organic compound such as a passive matrix light-emitting apparatus for a color display panel, a surface luminous, or an area color light-emitting apparatus for electric spectaculars device.

First, a device is formed on a glass substrate (a first substrate 300). A metal film 301, which is a tungsten film (having a thickness ranging from 10 to 200 nm, preferably, from 50 to 75 nm) here, is formed on the glass substrate by sputtering, and an oxide film 302, which is a silicon oxide film (having a thickness ranging from 150 to 200 nm) here, is stacked thereon without exposing to the air. The tungsten film and the silicon oxide films are formed over the edge portion of the substrate in case of using sputtering. It is preferable that the deposited tungsten film and silicon oxide film are removed selectively by $O_2$ ashing. In the following peeling process, a boundary face of the tungsten film and a silicon oxide film or the internal silicon oxide film is separated.

Next, a silicon oxynitride film as a base insulating film (thickness of 100 nm) is formed by PCVD, and an amorphous silicon film (thickness of 54 nm) is stacked thereon without exposing to the air.

The amorphous silicon film contains hydrogen. In the case of heating at not less than 500° C. the amorphous silicon film to form a polysilicon film, hydrogen can be diffused as well as forming the polysilicon film. Various devices as typified by a TFT (a thin film diode, a pin-junction silicon photoelectric converter, a silicon resistance element, a sensor device (typically, a pressure-sensitive fingerprints sensor using polysilicon)) can be formed by using the resulted polysilicon film. In addition, the present invention can be applied to the TFT that uses an amorphous silicon film as an active layer.

Here, a polysilicon film is formed by using known technique (solid-phase growth, laser crystallization, crystallization using catalyst metal), and an island like semiconductor region is formed by patterning, then, a top gate TFT 303 is formed that uses the island like semiconductor region as an active layer. A gate insulating film is formed, a gate electrode is formed, and a source or a drain region is formed by doping to the active layer, then, an interlayer insulating film is formed, and then, a source or a drain electrode is formed, respectively. Lastly, an activation is carried out.

Next, a film containing an organic compound (hereinafter, organic compound layer) is interposed between a pair of electrodes (an anode and a cathode). Then, a first electrode for forming a light-emitting device that can achieve fluorescence or phosphorescence by applying electronic field to the pair of electrodes is formed. Here, the first electrode 304 that can serve as an anode or a cathode is formed of a large work function metal film (Cr, Pt, W, or the like), or a transparent conductive film (Indium tin oxide alloy (ITO), indium oxide zinc oxide alloy ($In_2O_3$—ZnO), zinc oxide (ZnO), or the like). An example of forming the first electrode 304 for serving as an anode is described.

In case that the source electrode or the drain electrode of a TFT serves as a first electrode, or a first electrode in contact with the source region or a drain region is formed separately, the TFT includes the first electrode.

A bank 305a is formed on the edge portion of the first electrode (anode) as encircling the periphery of the first electrode. To improve coverage, the upper edge portion or the bottom edge portion of the bank is formed to have a curved surface having curvature. For example, in the case that a positive type photosensitive acrylic is used as a material for the bank, it is preferable that only the upper edge portion of the bank is formed to have a curved surface having radius of curvature (from 0.2 to 3 μm). Either a negative type that is an insoluble material in etchant according to light to which photosensitive material is exposed or a positive type that is dissoluble in etchant according to light can be used as the bank.

Figure 3A:
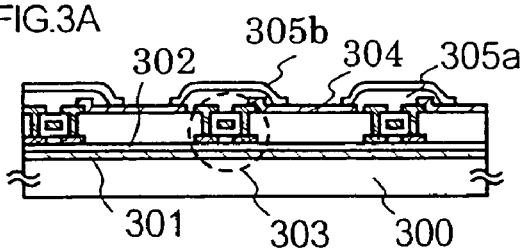
FIGS. 3A to 3J are views according to Embodiment Mode 2.

Further, in the case of stacking a plurality of organic resin, there is a threat that a part the plural organic resin is melted or the plural organic resin is too adhesive. Therefore, in the case of using organic resin as a material for the bank, the bank 305a is preferable to be covered by an inorganic insulating film (a $SiN_x$ film, a $SiN_xO_y$ film, an $AlN_x$ film, or an $AlN_xO_y$ film) in order to make it easy to remove water-soluble resin after coating it over the whole surface in the following process. The inorganic insulating film serves as a part of the bank 305b (FIG. 3A).

Figure 3B:
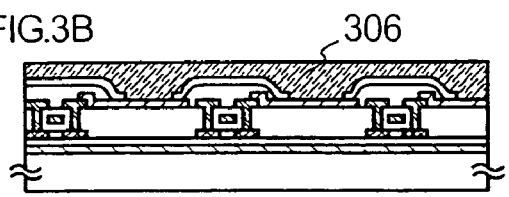

Next, an adhesive that is soluble in water or alcohol is coated over the whole surface and baked. The adhesive may be composed of, for example, epoxy series, acrylate series, silicon series, or the like. Here, a film formed of water-soluble resin (TOAGOSEI Co., Ltd.: VL-WSHL10) 306 is spin-coated to have a thickness of 30 μm, and exposed for two minutes to be partially cured, then, exposed its back to UV rays for 2.5 minutes, and then, exposed its surface for 10 minutes to be fully cured (FIG. 3B).

The adhesiveness of the metal film 301 and the oxide film 302 is partly weakened for easy peeling-off. The partly wakening process of adhesiveness is carried out by irradiating laser light on the region that is to be peeled-off of the metal film 301 or the oxide film 302 along with the periphery thereof, or pressuring locally from outside on the region that is to be peeled-off along with the periphery thereof for damaging the inside or a part of the boundary face of the oxide film 302. Specifically, a hard needle such as a diamond pen may be attached perpendicular to the region to be peeled-off and moved along with the periphery thereof with applying loading. Preferably, a scriber device can be used to move with applying loading on the region with press force ranging from 0.1 to 2 mm. It is important to carry out some processes for easy peeling-off, that is, prepare for peeling-off process. Such preparatory process for weakening selectively (partly) the adhesiveness will prevent poor peeling-off and improve process yield.

Figure 3C:
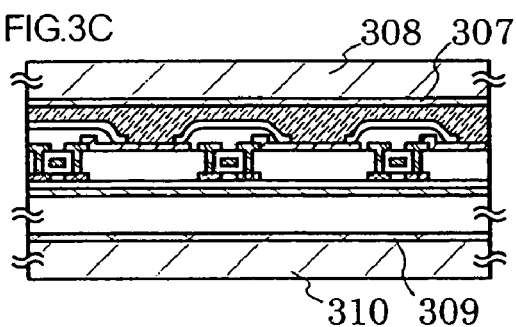

Next, a second substrate 308 is bonded to a film formed of water-soluble resin 306 with a two-sided tape 307. Then, a third substrate 310 is bonded to the first substrate 300 with a two-sided tape 309 (FIG. 3C). The third substrate 310 prevents the first substrate 300 from damaging in the following peeling-off process. For the second substrate 308 and the third substrate 310, the substrate that has higher rigidity than that of the first substrate 300, for example, a quartz substrate or a semiconductor substrate, is preferably to be used.

Figure 3D:
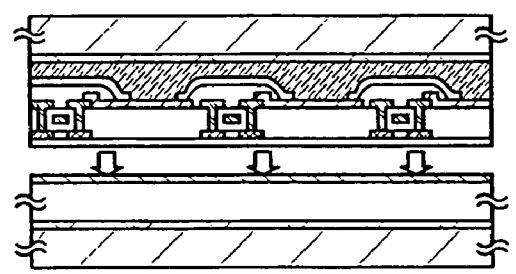
Figure 3E:
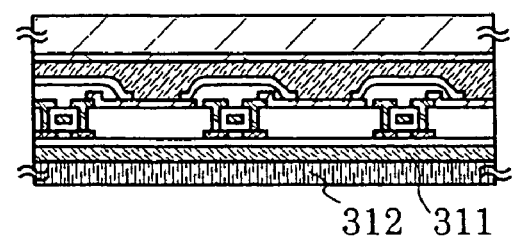

The first substrate 300 provided with the metal film 301 is peeled-off from the region, which is partly weakened its adhesiveness by a physical means. The first substrate 300 can be peeled-off by comparatively small force (for example, man's hand, air pressure of gas sprayed from a nozzle, ultrasonic waves, or the like). Thus, the release layer formed on the oxide layer 302 can be separated from the first electrode 300. FIG. 3D is a state of after peeling-off process.

Next, a fourth substrate 312 is bonded to the oxide layer 302 (and the peeling-off layer) with the adhesive 311 (FIG. 3E) It is important that the adhesive strength of the fourth substrate 312 and the oxide layer 302 (and the release layer) is higher than that of the second substrate 308 and the release layer by the two-sided tape 307.

It is preferable that a plastic substrate having high thermal conductivity ranging from 2 to 30 W/mK is used for the fourth substrate 312. The plastic substrate is formed of a mixture of ceramics; lead-free solders; and synthetic resin composed of polypropylene, polypropylene sulfide, polycarbonate, polyetherimide, polyphenylene sulfide, polyphenylene oxide, polysulfone, or polyphthalamide. In the plastic substrate, melted metals are connected each other like a network through ceramics particles.

As the adhesive 311, various types of curing adhesive, for example, a photo-curing adhesive such as a reaction-curing adhesive, a heat-curing adhesive, a UV-curing adhesive, or the like, or an anaerobiotic adhesive is utilized. It is more preferable that the adhesive 311 be containing powder composed of silver, nickel, aluminum, aluminum nitride, or filler to have high thermal conductivity.

Figure 3F:
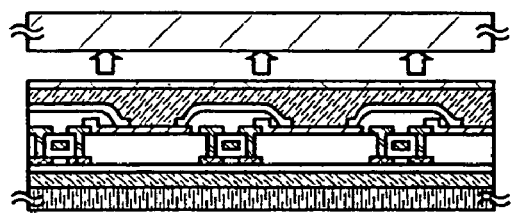

The second substrate 308 is removed from the two-sided tape 307 (FIG. 3F).

Figure 3G:
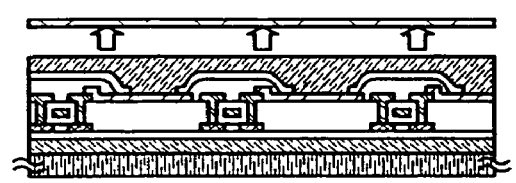

Then, the two-sided tape 307 is removed from the film formed of water-soluble resin 306 (FIG. 3G).

Figure 3H:
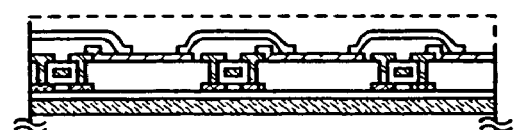

And then, the film formed of water-soluble resin 306 is melted with water and removed (FIG. 3H). If residue of the water-soluble resin is left on the first electrode 304, it will cause the deterioration of the device. Consequently, it is preferable that the surface of the first electrode 304 be rinsed or treated in $O_2$ plasma.

If it is necessary, the surface of the first electrode 304 is rubbed and washed by using a porous sponge (typically, a sponge of PVA (polyvinyl alcohol) or nylon) soaked in a surfactant (weak alkaline).

Immediately prior to forming a layer containing an organic compound 313, the substrate is heated in a vacuum for removing absorbed moisture in the whole substrate that is provided with a TFT and a bank. Moreover, the first electrode may be exposed to ultraviolet radiation immediately prior to forming the layer containing the organic compound 313.

The layer containing the organic compound 313 is formed selectively over the first electrode (anode) by vapor deposition using an evaporation mask or ink-jetting. As the layer containing the organic compound 313, a polymer material, a low molecular material, an inorganic material, a mixed layer formed of the above materials, a layer formed by dispersing above materials, or a lamination layer formed by stacking appropriate combination of the above materials.

Figure 3I:
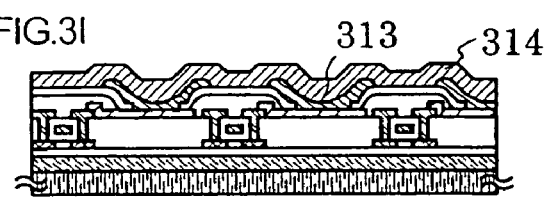

A second electrode (cathode) 314 is formed on the layer containing the organic compound 303 (FIG. 3I). For forming the cathode 314, a lamination layer of a thin film, which has a thickness of being transparent to light, formed of a small work function material (Al, Ag, Li, Ca, or alloy of these materials such as MgAg, MgIn, AlLi, $CaF_2$, or CaN) and a transparent conductive film is utilized. If necessary, a protective layer is formed for covering the second electrode by sputtering or vapor deposition. The transparent protective lamination layer may be formed of a silicon nitride film, silicon oxide film, a silicon nitride oxide film (SiNO film: a ratio of N to O composition is N>O)), or silicon oxynitride (SiON film: a ratio of N to O composition is N<O), or a thin film containing carbon as its main component (for example, DLC film, or CN film) formed by sputtering or CVD.

Figure 3J:
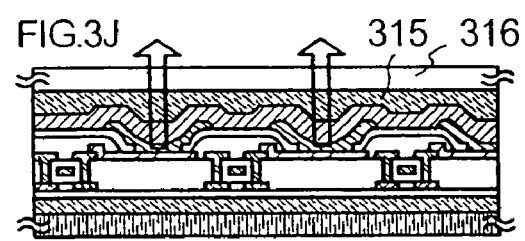

A sealing agent (not shown) containing a gap agent for keeping a space between a pair of substrate is applied in a desired pattern to a fifth substrate 316 that serves as a sealing substrate. The fifth substrate may be transparent to light in the present case since an example of the light-emitting device in which light generated therein emit through the fifth substrate 316 is described. In order to lighten the device, a plastic film on which a barrier film (a $SiN_x$ film, a $SiN_xO_y$ film, an $AlN_x$ film, or an $AlN_xO_y$ film) is formed is used for the fifth substrate 316. Then, the sealing substrate (the fifth substrate) applied with a sealing agent is bonded to an active matrix substrate so that the sealing pattern is aligned to encircle the light-emitting portion for sealing the light-emitting device. In addition, the sealing substrate is bonded so that the space encircled by the sealing agent is filled with an adhesive 315 formed of a transparent organic resin (FIG. 3J).

In consequence, a light-emitting apparatus provided with a TFT and a light-emitting device including the plastic substrate 312 having high thermal conductivity and the fifth substrate 316 as a support medium. The resulted light-emitting apparatus can radiate heat generated in the device during driving operation since the plastic substrate has high thermal conductivity. Further, the light-emitting apparatus can be manufactured into be thin, light-weight, and flexible since plastic substrate is used as a support medium.

Here, a peeling-off process that separates the first substrate by splitting the region of the boundary face of a tungsten film and a silicon oxide film is used, but not exclusively, the first substrate may be separated by laser irradiation after forming an amorphous silicon film containing hydrogen on the first substrate, or by etching or mechanical etching using solution or gas.

This embodiment mode can be freely combined with Embodiment Mode 1.

Embodiment Mode 3

An example of a method for manufacturing a light-emitting apparatus in which light generated in a light-emitting device is extracted through a first electrode will be described. Since partway of this embodiment mode is the same as Embodiment Mode 2, further explanation will be omitted, and like components are denoted by like numerals as of Embodiment Mode 2.

The process up to peeling-off the first substrate is the same as Embodiment Mode 2. Note that a transparent conductive film is used for a first electrode 304 in order to transmit light.

Figure 4A:
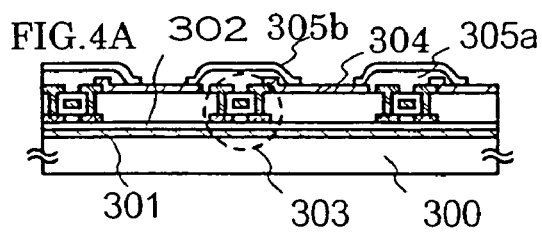
FIGS. 4A to 4J are views according to Embodiment Mode 3.
Figure 4B:
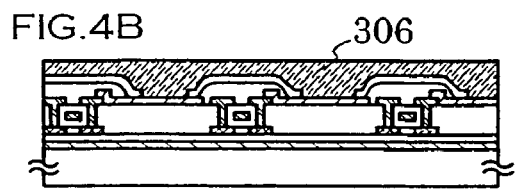
Figure 4C:
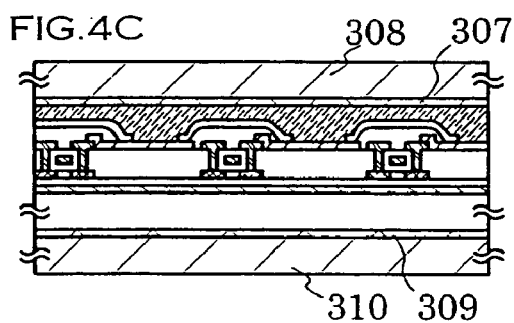
Figure 4D:
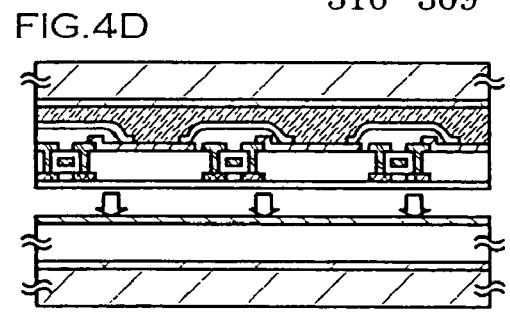
Figure 4E:
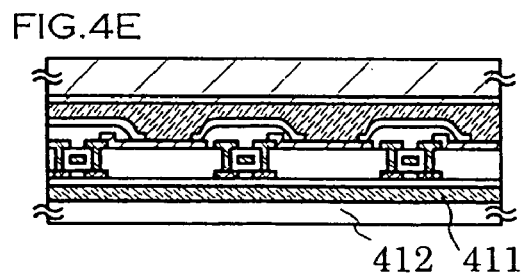

When the state shown in FIG. 4D is achieved according to Embodiment Mode 2, a transparent plastic substrate 412 is bonded thereto with an adhesive 411 (FIG. 4E).

Figure 4F:
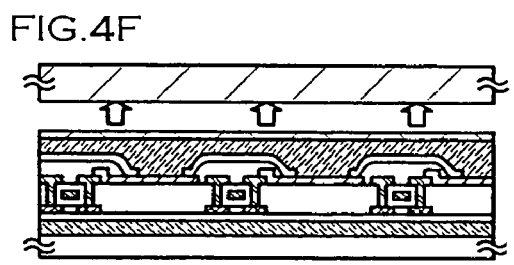

A second substrate 308 is separated from the two-sided tape 307 (FIG. 4F).

Figure 4G:
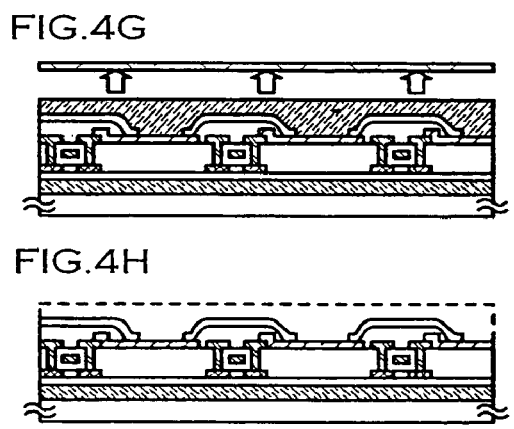

Then, the two-sided tape 307 is removed (FIG. 4G).

Figure 4H:
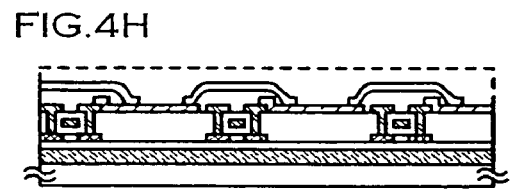

And then, the film formed of water-soluble resin 306 is melted by water and removed (FIG. 4H). If residue of the water-soluble resin is left on the first electrode 304, it will cause the deterioration of the device. Consequently, it is preferable that the surface of the first electrode 304 is rinsed or treated in $O_2$ plasma.

If it is necessary, the surface of the first electrode 304 is rubbed and washed by using a porous sponge (typically, a sponge of PVA (polyvinyl alcohol) or nylon) soaked in a surfactant (weak alkaline).

Immediately prior to forming a layer containing an organic compound 413, the substrate is heated in a vacuum for removing adsorbed moisture in the whole substrate that is provided with a TFT and a bank. Moreover, immediately prior to forming the layer containing the organic compound 413, the first electrode may be exposed to ultraviolet radiation.

The layer containing the organic compound 413 is formed selectively over the first electrode (anode) by vapor deposition using an evaporation mask or ink-jetting. As the layer containing the organic compound 413, a polymer material, a low molecular material, an inorganic material, a mixed layer formed of the above materials, a layer formed by dispersing above materials, or a lamination layer formed by stacking appropriate combination of the above materials.

Figure 4I:
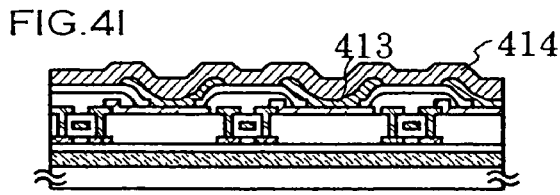

A second electrode (cathode) 414 is formed on the layer containing the organic compound 413 (FIG. 4I). For forming the cathode 414, a lamination layer of a thin film, which is transparent to light, formed of a small work function material (Al, Ag, Li, Ca, or alloy of these materials such as MgAg, MgIn, AlLi, $CaF_2$, or CaN) is utilized. If necessary, a protective layer is formed for covering the second electrode by sputtering or vapor deposition. The protective lamination layer may be formed of a silicon nitride film, silicon oxide film, a silicon nitride oxide film (SiNO film: a ratio of N to O composition is N>O)), or silicon oxynitride (SiON film: a ratio of N to O composition is N<O), or a thin film containing carbon as its main component (for example, DLC film, or CN film) formed by sputtering or CVD.

Figure 4J:
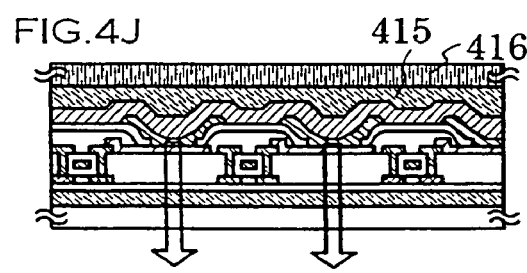

A sealing agent (not shown) containing a gap agent for keeping a space between a pair of substrate is applied in a desired pattern to a fifth substrate 416 that serves as a sealing substrate. The fifth substrate 416 can be translucent or opaque in the present case since an example of the light-emitting device in which light generated therein emit through the third substrate 412 is described. Then, the fifth substrate 416 applied with a sealing agent is bonded to an active matrix substrate so that the sealing pattern is aligned to encircle the light-emitting portion for sealing the light-emitting device. In addition, the sealing substrate is bonded so that the space encircled by the sealing agent is filled with an adhesive 415 formed of a transparent organic resin (FIG. 4J).

In consequence, a light-emitting apparatus provided with a TFT and a light-emitting device including the plastic substrate 412 having high thermal conductivity and the fifth substrate 416 as a support medium. The resulted light-emitting apparatus can radiate heat generated in the device during driving operation since the plastic substrate has high thermal conductivity. Further, the light-emitting apparatus can be manufactured to be thin, light-weight, and flexible since plastic substrate is used as a support medium.

This embodiment mode can be freely combined with Embodiment Mode 1 or Embodiment Mode 2.

The present invention having above-described constitution will be further explained with the following embodiments.

Embodiment 1

Here, a method of simultaneously manufacturing TFTs (an n-channel TFT and a p-channel TFT) on a substrate will be described in detail. Although shown here is an example of an active matrix substrate fabricating process up to and including a TFT fabricating process, there is no limitation. It is needless to say that a light-emitting apparatus having a light-emitting layer containing an organic compound can be manufactured, if the arrangement of TFTs and the materials of pixel electrodes are appropriately changed.

A glass substrate (#1737) is used as a substrate. First, a silicon oxynitride layer is formed to have a thickness of 100 nm on the substrate by PCVD.

Subsequently, a tungsten layer is formed to have a thickness of 50 nm by sputtering as a metal layer, and a silicon oxide layer is continuously formed to have a thickness of 200 nm by sputtering as an oxide layer without being exposed to the atmosphere. The silicon oxide layer is formed under the conditions, that is, a RF sputtering apparatus is used; a silicon oxide is used as sputtering targets (the diameter of 30.5 cm); argon gas for heating the substrate is 30 sccm; the substrate temperature is 300° C.; the pressure is 0.4 Pa; the electric power is 3 kW; and argon flow rate/oxygen flow rate=10 sccm/30 sccm.

Subsequently, the tungsten layer formed on the periphery portions or the edges of the substrate is removed by $O_2$ ashing.

Subsequently, a silicon oxynitride film is formed using $SiH_4$ and $N_2O$ as material gases (composition ratio: Si=32%, O=59%, N=7%, H=2%) into a lamination layer to have a thickness of 100 nm at 300° C. by PCVD. Further, a semiconductor film having an amorphous configuration (in this case, amorphous silicon film) is formed to have a thickness of 54 nm with $SiH_4$ gas at 300° C. by PCVD without exposure to an atmosphere. This amorphous silicon film contains hydrogen, the hydrogen will be diffused by a subsequent heat treatment, and the amorphous silicon film can be peeled-off by a physical means in the inside of the oxide layer or the interface of the oxide layer.

Then, a nickel acetate salt solution containing nickel of 10 ppm by weight is coated by a spinner. Nickel elements can be sputtered on the entire surface instead of being coated. Then, heat treatment is carried out to crystallize and form a semiconductor film having a crystalline configuration (here, a polysilicon layer). Here, after the heat treatment (500° C. for 1 hour) for dehydrogenation is carried out, and the heat treatment (550° C. for 4 hours) for crystallization is carried out, then, a silicon film having a crystalline configuration is formed. Also, the heat treatment (500° C. for 1 hour) for dehydrogenation has also a function of a heat treatment for diffusing the hydrogen contained in the amorphous silicon layer to a boundary face between a W film and a silicon oxide layer. Also note that, although a crystallization technique using nickel as a metal element for promoting crystallization of silicon is used here, other known crystallization technique, for example, a solid-phase growth method and a laser crystallization method may be used.

Next, after the oxide film on the surface of the silicon film having a crystalline configuration is removed by dilute hydrofluoric acid or the like, laser light (XeCl: wavelength of 308 nm) is irradiated thereon for raising a crystallization rate and repairing defects remaining in crystal grains is performed in an atmosphere or in an oxygen atmosphere. Excimer laser light with a wavelength of 400 nm or less, or second harmonic wave or third harmonic wave of a YAG laser is used for the laser light. In any case, pulse laser light with a repetition frequency ranging approximately from 10 to 1000 Hz is used, the pulse laser light is condensed to 100 to 500 mJ/cm$^2$ by an optical system, and irradiated with an overlap ratio of 90 to 95%, whereby the silicon film surface may be scanned. Here, laser light is irradiated in an atmosphere in the condition of a repetition frequency of 30 Hz and energy density of 470 mJ/cm$^2$. Note that an oxide film is formed on the surface by the first laser light irradiation since the irradiation is conducted in an atmosphere or in an oxygen atmosphere. Though an example of using the pulse laser is shown here, the continuous oscillation laser may also be used. When an amorphous semiconductor film is crystallized, it is preferable that the second harmonic through the fourth harmonic of basic waves is applied by using the solid state laser which is capable of continuous oscillation in order to obtain a crystal in a large grain size. Typically, it is preferable that the second harmonic (having a wavelength of 532 nm) or the third harmonic (having a wavelength of 355 nm) of an Nd:YVO$_4$ laser (basic wave of 1064 nm) is applied. Specifically, laser beams emitted from the continuous oscillation type YVO$_4$ laser with 10 W output is converted into a harmonic by using the non-linear optical elements. Also, a method of emitting a harmonic by applying YVO$_4$ crystal and the non-linear optical elements into a resonator can be given. Then, more preferably, the laser beams are formed so as to have a rectangular shape or an elliptical shape by an optical system, and irradiated on the surface. At this time, the energy density of approximately 0.01 to 100 MW/cm$^2$ (preferably 0.1 to 10 MW/cm$^2$) is required. The semiconductor film is irradiated with the laser light by moving relatively at approximately 10 to 2000 cm/s rate corresponding to the laser beams.

In addition to the oxide film formed by this laser irradiation, a barrier layer comprising an oxide film is formed to have a thickness ranging from 1 to 5 nm in total by treating the surface with ozone water for 120 seconds. Though the barrier layer is formed by using ozone water here, ultraviolet light may be irradiated in an oxygen atmosphere to the surface of the semiconductor film having the crystal structure in order to be oxidized or the surface of the semiconductor film having the crystal structure may be treated in oxide plasma in order to be oxidized for forming the barrier layer. In addition, a barrier layer may be formed by forming an oxide film having a thickness approximately ranging from 1 to 10 nm by PCVD, sputtering, vapor deposition, or the like. Further, the oxide film formed by the laser light irradiation may be removed before forming the barrier layer.

On the barrier layer, an amorphous silicon film containing argon elements, which serve as a gettering site, is formed to have a thickness ranging from 10 to 400 nm, in this embodiment, 100 nm by sputtering. In this embodiment, an amorphous silicon film containing argon is formed under an atmosphere containing argon using silicon targets. The amorphous silicon film containing argon is formed in the deposition conditions, that is, a flow ratio of monosilane to argon ($SiH_4$:Ar) is 1:99; pressure is 6.665 Pa (0.05 Torr); RF power density is 0.087 W/cm$^2$; and temperature is 350° C. in the case of using PCVD.

Then, an oven heated at 650° C. is used for heat treatment for 3 minutes for gettering to reduce the nickel concentration in the semiconductor film having a crystal structure. A lamp annealing apparatus may be used instead of the oven.

Subsequently, the amorphous silicon film containing the argon element, which serves the gettering site, is selectively removed using the barrier layer as an etching stopper, thereafter the barrier layer is selectively removed by dilute hydrofluoric acid. Note that since nickel is likely to move to a region having a high oxygen concentration during gettering, it is desirable that the barrier layer comprised of the oxide film is removed after the gettering.

Then, after a thin oxide film is formed from ozone water on the surface of the obtained silicon film having a crystal structure (also referred to as polysilicon film), a mask made of resist is formed, and an etching process is conducted thereto to obtain a desired shape, thereby forming the island-like semiconductor layers separated from one another. After the formation of the semiconductor layers, the mask made of resist is removed.

Through the above processes, a nitride layer (a metal layer), an oxide layer, and a base insulating film are formed on a substrate to obtain a semiconductor film having a crystal structure. And, the semiconductor film is etched into isolated island like semiconductor films having desired shapes. Then, a TFT that uses the resulted semiconductor layers as an active layer is fabricated.

Next, the oxide film is removed with the etchant containing hydrofluoric acid, and at the same time, the surface of the silicon film is washed. Thereafter, an insulating film containing silicon as its main components, which serves as a gate insulating film, is formed. In this embodiment, a silicon oxynitride film (composition ratio: Si=32%, O=59%, N=7%, H=2%) is formed to have a thickness of 115 nm by PCVD.

Next, a first conductive film having a thickness ranging from 20 to 100 nm and a second conductive film having a thickness ranging form 100 to 400 nm are stacked on the gate insulating film. In this embodiment, a 50 nm-thick tantalum nitride film and a 370 nm-thick tungsten film are sequentially stacked on the gate insulating film.

As a conductive material for forming the first conductive film and the second conductive film, an element selected from the group consisting of Ta, W, Ti, Mo, Al and Cu, or an alloy material or a compound material containing the above elements as its main components is utilized. Further, a semiconductor film as typified by a polycrystalline silicon film doped with an impurity element such as phosphorous or an AgPdCu alloy may be used as the first conductive film and the second conductive film. In addition, the present invention is not limited to a two-layer structure. For example, a three-layer structure may be adopted in which a 50 nm-thick tungsten film, an alloy film of aluminum and silicon (Al—Si) of 500 nm-thick, and a 30 nm-thick titanium nitride film are sequentially stacked. Moreover, in case of a three-layer structure, tungsten nitride may be used instead of tungsten of the first conductive film, an alloy film of aluminum and titanium (Al—Ti) may be used instead of the alloy film of aluminum and silicon (Al—Si) of the second conductive film, and a titanium film may be used instead of the titanium nitride film of the third conductive film. In addition, a single layer structure may also be adopted.

Next, resist masks are formed by light exposure. Then, a first etching treatment is carried out for forming gate electrodes and wirings. The first etching treatment is carried out under the first and the second etching conditions. It is preferable to carry out ICP (inductively coupled plasma) etching. The films can be etched to have desired taper shapes by ICP etching in suitably adjusted etching conditions (that is, the amount of power applied to a coiled electrode, the amount of power applied to an electrode on the substrate side, the temperature of the electrode on the substrate side, etc.). As etching gas, chlorine-based gas as typified by $Cl_2$, $BCl_3$, $SiCl_4$, or $CCl_4$, fluorine-based gas as typified by $CF_4$, $SF_6$, or $NF_3$, or $O_2$ are appropriately utilized.

Through the above described first etching process, each the edge portion of the first conductive layer and the second conductive layer is formed to have a tapered shape due to the effect of the bias voltage applied to the substrate side by forming the shape of the resist mask into an appropriate shape. The angle of the tapered portion may be ranging from 15 to 45°.

Thus, first shape conductive layers that comprise the first conductive layer and the second conductive layer are formed by the first etching process. Ranging appropriately from 10 to 20 nm-thick insulating film, which serves as the gate insulating film, is etched. Consequently, the region that has thin thickness and is not covered by the first shape conductive layers becomes a gate insulating film.

Next, a second etching process is conducted without removing the masks formed of resist.

By the second etching process, the taper angle of W becomes 70°. The second conductive layer is formed by the second etching process. On the other hand, the first conductive layers are hardly etched. Practically, the width of the first conductive layer may be reduced approximately 0.3 μm, namely, approximately 0.6 μm in the total line width in comparison with before carrying out the second etching process. Thus, the size of the taper of the first conductive layer is hardly changed.

Next, the resist masks are removed, and a first doping process is carried out. Ion doping or ion implantation may be carried out as the doping process. Ion doping is carried out under the conditions of a dosage of $1.5 \times 10^{14}$ atoms/cm² and an accelerating voltage ranging from 60 to 100 keV. As an impurity element imparting n-type conductivity, phosphorous (P) or arsenic (As) is typically used. In this case, the first conductive layer and the second conductive layer become masks against the impurity element imparting n-type conductivity, and first impurity regions are formed in a self-aligning manner. The impurity element imparting n-type conductivity is added to the first impurity regions in a concentration range of $1 \times 10^{16}$ to $1 \times 10^{17}$/cm³. Here, the region having the same concentration range as the first impurity region is also referred to as an n⁻⁻ region.

Note that although the first doping process is carried out after removing the resist masks in this embodiment, the first doping process may be carried out without removing the resist masks.

Next, resist masks are formed (a mask for protecting a channel formation region of a semiconductor layer to which a p-channel TFT of a driver circuit is formed and the periphery thereof, a mask for protecting a channel formation region of a semiconductor layer to which one of n-channel TFTs is formed and the periphery thereof, a mask for protecting a channel formation region of a semiconductor layer to which a TFT of a pixel portion is formed, the periphery thereof, and a retention volume region), and a second doping process is carried out. The ion doping of phosphorous (P) is carried out in the second doping process under the conditions, that is, a dosage is $1.5 \times 10^{15}$ atoms/cm²; and an accelerating voltage is ranging from 60 to 100 keV. Here, impurity regions are formed in the respective semiconductor layers in a self-aligning manner using the second conductive layers as masks. Of course, phosphorous is not added to the regions covered by the masks. Thus, second impurity regions 140 to 142 and a third impurity region 144 are formed. Impurity elements imparting n-type conductivity are added to the second impurity regions with concentrations ranging form $1 \times 10^{20}$ to $1 \times 10^{21}$/cm³. Here, the region having the same concentrations as the second impurity region is also referred to as an n⁺ region.

Further, the third impurity region is formed at a lower concentration than the second impurity region using the first conductive layer, and is doped with impurity elements imparting n-type conductivity with concentrations ranging from $1 \times 10^{18}$ to $1 \times 10^{19}$/cm³. Note that since impurity elements are doped to the third impurity region passing through the first conductive layer in a tapered shape, the concentration gradient in the third impurity region can be seen as impurity concentrations are increased toward the edge portion of the tapered portion. Here, the region having the same concentrations as the third impurity region is referred to as an n⁻ region.

Next, after the masks formed of resist are removed, new masks formed of resist are formed (masks for covering the n-channel TFT) Then, a third doping process is carried out.

In the driving circuit, by the third doping process as described above, fourth impurity regions and fifth impurity regions are formed in which impurity elements imparting p-type conductivity are doped to the semiconductor layer that is for forming the p-channel TFT and to the semiconductor layer that is for forming a retention volume.

Further, impurity elements imparting p-type conductivity with concentrations ranging from $1\times10^{20}$ to $1\times10^{21}/cm^3$ is doped to the fourth impurity regions. Note that, although phosphorous (P) has been doped to the fourth impurity regions (n$^{--}$ region) in the preceding step, impurity elements imparting p-type conductivity with concentrations of 1.5 to 3 times higher than that of phosphorous, so that the fourth impurity region is p-type. Here, the region having the same concentrations as the fourth impurity region is also referred to a p$^+$ region.

Further, fifth impurity regions are formed in regions overlapping the tapered portion of the second conductive layer, and are added with impurity elements imparting p-type conductivity with concentrations ranging from $1\times10^{18}$ to $1\times10^{20}/cm^3$. Here, the region having the same concentrations as the fifth impurity region is also referred to as a p$^-$ region.

Through the above-described processes, the impurity regions having n-type or p-type conductivity are formed in the respective semiconductor layers.

Next, an insulating film that covers substantially the entire surface is formed. In this embodiment, a 50 nm-thick silicon oxide film is formed by PCVD. Of course, the insulating film is not limited to a silicon oxide film, but another insulating films containing silicon of a single layer or a lamination layer.

Then, a process of activating impurity elements doped to the respective semiconductor layers is carried out. This activation process is carried out by a rapid thermal annealing (RTA) using a lamp light source, a YAG laser or an excimer laser irradiation onto the back surface, heat treatment using a furnace, or a combination thereof.

Further, although an example of forming the insulating film before the activation is shown in this embodiment, the insulating film may be formed after the activation.

Next, a first interlayer insulating film formed of a silicon nitride film is formed, and heated (300 to 550° C. for 1 to 12 hours) Then, the semiconductor layer is hydrogenated for terminating dangling bonds of the semiconductor layers using hydrogen in the first interlayer insulating film. The semiconductor layers can be hydrogenated irrespective of the existence of an insulating film formed of a silicon oxide film. Incidentally, in this embodiment, a material containing aluminum as its main components is used for the second conductive layer, and thus, it is important that the hydrogenation is carried out under such the heat treatment condition that the second conductive layer can withstand. In addition, a plasma hydrogenation (using hydrogen excited by plasma) may be also carried out.

Next, a second interlayer insulating film is formed using an organic insulating material on the first interlayer insulating film. In this embodiment, an acrylic resin film is formed to have a thickness of 1.6 μm. A third interlayer insulating film is formed using a silicon nitride film. Then, a contact hole that reaches a source wiring and contact holes that reach the respective impurity regions are formed.

Thereafter, a source electrode or a drain electrode is formed using Al, Ti, Mo, W, or the like.

As described above, an n-channel TFT and a p-channel TFT can be formed.

Lastly, a plastic substrate is pasted, and the layer including TFTs are separated from the substrate. In the case of using high conductivity materials for the plastic substrate, high reliable semiconductor apparatus that has high heat radiating property can be manufactured.

A plastic substrate is formed using the resin that is made in the way hereinafter described that ceramics and low-melting point metals (lead-free solders such as tin, bismuth, and zinc) are mixed in synthetic-resin composed of polypropylene, polypropylene sulfide, polycarbonate, polyetherimide, polyphenylene sulfide, polyphenylene oxide, polysulfone, or polyphthalamide to have high thermal conductivity ranging from 2 to 30 W/mK.

The substrate can be peeled-off if the mechanical strength of the layer including a TFT (a release layer) is sufficiently that is formed on the oxide layer.

Figure 6:
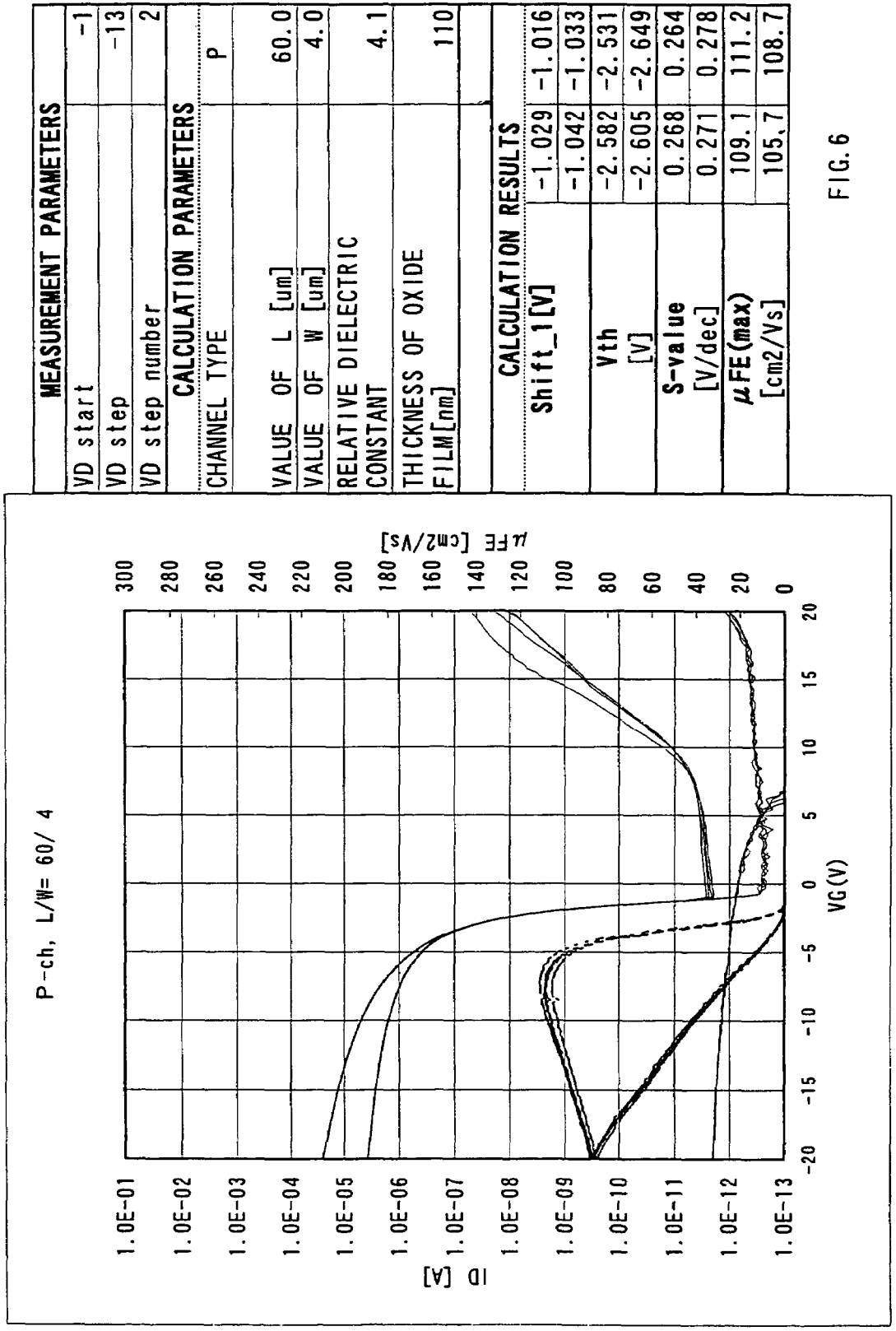
FIG. 6 shows an electric characteristic of a TFT according to Embodiment 1.

The TFT characteristics are not changed by the peeling-off. FIG. 6 shows electric characteristics of a p-channel type TFT.

In this embodiment, an example of peeling-off the substrate at the state of forming the TFT and transferring to the plastic substrate, however, the substrate can also be peeled-off after forming a light-emitting device using a layer including a bank, a layer containing an organic compound, or the like, and transferred to the plastic substrate. Further, an opposing substrate may be bonded by using the electrode of the TFT as a reflection electrode, and liquid crystals are filled in therebetween, then, the substrate may be peeled-off, the release layer is bonded to the plastic substrate for manufacturing a reflective liquid crystal display apparatus.

This embodiment can be freely combined with any one of Embodiment Mode 1 to Embodiment Mode 3.

Embodiment 2

In this embodiment, an example of manufacturing a light-emitting apparatus (top emission structure) provided with a light-emitting device including an organic compound layer as a light-emitting layer on a substrate having an insulating surface is described with reference to FIG. 2.

FIG. 2A is a top-surface view of a light-emitting apparatus. FIG. 2B is a cross-sectional view of FIG. 2A taken along the line of A-A'. Reference numeral 1101 denoted by a dotted line denotes a source signal line driver circuit; 1102 denotes a pixel portion; 1103, agate signal line driver circuit; 1104, a transparent sealing substrate; and 1105, a first sealing agent. Space encircled by the first sealing agent 1105 is filled with a transparent second sealing agent 1107. In addition, the first sealing agent 1105 contains a gap agent for keeping the interval of substrates.

Further, reference numeral 1108 denotes a wiring for transmitting signals inputted to the source signal line driver circuit 1101 and the gate signal line driver circuit 1103. The wiring 1108 receives a video signal or clock signal from a FPC (flexible printed circuit) 1109 that serves as an external input terminal. Although only FPC is illustrated, a printed wiring board (PWB) may be attached to the FPC.

The cross-sectional structure of the light-emitting apparatus is described with reference FIG. 2B. A driver circuit and a pixel portion are formed on a substrate having high thermal conductivity 1110 via an adhesive 1140. In FIG. 2B, the source signal line driver circuit 1101 is illustrated as a driver circuit and the pixel portion 1102 is illustrated. Heat generated in the driver circuit and the pixel portion can be radiated by the substrate having high thermal conductivity 1110. A plastic substrate is formed using the resin that is made in the way hereinafter described, that is, ceramics such as boron nitride, aluminum nitride, magnesium oxide, beryllium nitride, or the like, and lead-free solders are mixed in synthetic-resin composed of polypropylene, polypropylene sulfide, polycarbonate, polyetherimide, polyphenylene sulfide, polyphenylene oxide, polysulfone, or polyphthalamide to have high thermal conductivity ranging from 2 to 30 W/mK. This embodiment corresponds to the structure shown in FIG. 1C described in Embodiment Mode 1.

A CMOS circuit comprising an n-channel TFT 1123 and a p-channel TFT 1124 is formed as the source signal driver circuit 1101. These TFT may also be obtained according to Embodiment 1. A TFT for forming the drive circuit can be formed by known CMOS circuit, PMOS circuit, or NMOS circuit. In this embodiment, a driver integrated circuit in which a driver circuit is formed on the substrate is shown, however, but not exclusively, the driver circuit can be formed outside instead of over the substrate. The structure of the TFT is not exclusive, either a top gate TFT or a bottom gate TFT may be utilized.

The pixel portion 1102 is formed from a plurality of pixels each of which includes a switching TFT 1111, a current controlling TFT 1112, and a first electrode (anode) 1113 which is electrically connected to a drain of the current-controlling TFT 1112. The current controlling TFT 1112 may be either an n-channel type TFT or a p-channel type TFT, but when it is connected to the anode, it is preferable to be a p-channel type TFT. It is also preferable that a storage capacitor (not shown) be appropriately provided. Here, though the cross-sectional structure of only one pixel out of thousands of pixels having two TFTs is exemplified, three or more TFTs can be provided appropriately with the one pixel.

Since the first electrode 1113 is directly connected to the drain of the TFT, it is preferable that a lower layer of the first electrode 1113 be formed of the material that can be an ohmic contact with the drain containing silicon and an uppermost layer of the first electrode 1113 which is in contact with an organic compound layer be formed of the material that has a large work function. For example, a three-layer structure comprising a titanium nitride film, a film containing aluminum as its main components, and a titanium nitride film, can have a low resistance as a wiring, and be a favorable ohmic contact with the drain, and also, serve as an anode. Further, the first electrode 1113 may be formed of a single layer such as a titanium nitride film, a chromium film, a tungsten film, a zinc film, a platinum film or the like, or a lamination layer of three or more layers.

Insulator 1114 (referred to as a bank, or the like) are formed to cover the edge of the first electrode (anode) 1113. The insulator 1114 may be formed of either an organic resin film or an insulating film containing silicon. Here, the insulator 1114 is formed into the shape as shown in FIG. 2 using a positive type photosensitive acrylic resin film To improve coverage, the upper edge portion or the bottom edge portion of the insulator 1114 is formed to have a curved surface having curvature. For example, in the case that a positive type photosensitive acrylic is used as a material for the insulator 1114, it is preferable to form only the upper edge portion of the insulator 1114*b* having a curved surface having radius of curvature (ranging from 0.2 to 3 µm). Either a negative type that become an insoluble material in etchant according to light for photosensitive material or a positive type that become dissoluble in etchant according to light for photosensitive material can be used as an insulator 1114.

In addition, the insulator 1114 may be covered by a protective film formed of an aluminum nitride film, an aluminum nitride oxide film, a thin film containing carbon as its main components, or a silicon nitride film.

An organic compound layer 1115 is selectively formed over the first electrode (anode) 1113 by vapor deposition using an evaporation mask or ink-jetting. Further, a second electrode (cathode) 1116 is formed over the organic compound layer 1115. As the cathode, a material having a small work function (for example, Al, Ag, Li, Ca, or alloys thereof such as MgAg, MgIn, AlLi, $CaF_2$, or CaN) may be used. In this embodiment, the second electrode (cathode) 1116 is formed of a lamination layer of a metal thin film having a thin thickness and a transparent conductive film (for example, an indium oxide-tin oxide alloy (ITO), an indium oxide-zinc oxide alloy ($In_2O_3$—ZnO), zinc oxide (ZnO), or the like) in order that the second electrode may transmit luminescence. A light-emitting device 1118 comprising the first electrode (anode) 1113, the organic compound layer 1115, and the second electrode (cathode) 1116 is thus fabricated. In this embodiment, since the example of the light-emitting device 1118 that emits white light is exemplified, a color filter (for ease of explanation, an overcoat layer is not shown here) comprising a coloring layer 1131 and a light-shielding layer (Black Matrix: BM) 1132 is provided.

Further, if each organic compound layer that can achieve R, G, and B emission is formed selectively, a full color display can be obtained without using a color filter.

A transparent protective layer 1117 is formed in order to seal the light-emitting device 1118. The transparent protective layer 1117 may be preferably formed of an insulating film containing silicon nitride or silicon nitride oxide as its main components, which is formed by sputtering (DC type of RF type) or PCVD, a thin film containing carbon as its main component (for example, DLC film, or CN film), or a lamination layer comprising the above. A silicon nitride film having high blocking effects against impurity elements such as moisture, alkali metals, or the like can be formed by using a silicon target under an atmosphere comprising nitrogen and argon. In addition, the transparent protective film can be formed by a film formation system that uses remote plasma. It is preferable that the total thickness of the transparent protective layer be formed to be thin as far as possible in order that light may pass through the transparent protective layer.

Further, in order to seal the light-emitting device 1118, the sealing substrate 1104 is bonded to the substrate by the first sealing agent 1105 and the second sealing agent 1107 under an inert gas atmosphere. It is preferable to use such as an epoxy resin as a material for the first sealing agent 1105 and the second sealing agent 1107. It is also preferable that the first sealing agent 1105 and the second sealing agent 1107 inhibit transmission of moisture or oxygen as possible.

Further, in this embodiment, a plastic substrate formed of fiberglass-reinforced plastics (FRP), polyvinylfluoride (PVF), Mylar, polyester, an acrylic resin, or the like, in addition to a glass substrate or a quartz substrate can be used as a material which constitutes the sealing substrate 1104. It is possible that a third sealing material is applied to the side face (exposed face) of the sealing substrate and the substrate after bonding the sealing substrate 1104 using the first sealant 1105 and the second sealant 1107.

By sealing the light-emitting device as described above, it becomes possible that the light-emitting device can be encapsulated completely and penetration of moisture or oxygen from outside that causes deterioration of the light-emitting device can be prevented. Consequently, light-emitting device having high reliability can be obtained.

Further, a both top and bottom emission light-emitting apparatus can be formed by using a transparent conductive film as the first electrode 1113.

Further, this embodiment can freely be combined with any one of Embodiment Mode 1 to Embodiment Mode 3, or Embodiment 1.

Embodiment 3

In Embodiment 2, an example of the light-emitting apparatus structure that has the light-emitting device in which an organic compound layer is formed over an anode and a cathode that is a transparent electrode is formed over the organic compound layer (hereinafter, "top emission structure") was described. On the other hand, a light-emitting apparatus may be formed to have the structure that has a light-emitting device in which an organic compound layer is formed over an anode and a cathode is formed over the organic compound layer (hereinafter referred to as "bottom emission structure"), and luminescence generated within the organic compound layer emits in the direction of a TFT through the anode that is a transparent electrode.

An example of a light-emitting apparatus having a bottom emission structure is shown in FIGS. 5A and 5B.

FIG. 5A is a top view of the light-emitting apparatus and FIG. 5B is a cross-sectional view of FIG. 5A taken along the line A-A'. Reference numeral 1201 indicated by the dotted line denotes a source signal line drive circuit; 1202 denotes a pixel portion; and 1203 denotes a gate signal line drive circuit. Further, reference numeral 1204 is a sealing substrate; 1205a is a sealing agent containing a gap material for spacing out enclosed spaces; and an inside area surrounded by the sealing agent 1205a is filled with a sealing agent 1205b. A desiccant may be provided in the sealing agent 1205b.

Reference number 1208 denotes a connection wiring for transmitting a signal to be inputted to the source signal line drive circuit 1201 and the gate signal line drive circuit 1203. The connection wiring 1208 receives a video signal or a clock signal from a flexible printed circuit (FPC) 1209 which becomes an external input terminal.

Subsequently, a cross-sectional structure will be described with reference to FIG. 5B. A drive circuit and a pixel portion are formed over a substrate 1210, but the source signal line drive circuit 1201 as the drive circuit and the pixel portion 1202 are shown in FIG. 5B. The source signal line drive circuit 1201 is formed of a CMOS circuit that is a combination of an n-channel type TFT 1223 and a p-channel type TFT 1224. These TFTs can be obtained according to Embodiment 1.

The pixel portion 1202 is formed from a plurality of pixels each of which includes a switching TFT 1211, a current controlling TFT 1212, and a first electrode (anode) 1213 formed of a transparent conductive film that is electrically connected to a drain of the current controlling TFT 1212.

In this embodiment, the first electrode 1213 is formed so as a part of which to be overlapped with a connecting electrode so as to be electrically connected to a drain region of the TFT 1212 via the connecting electrode. It is preferable that the first electrode 1213 be formed of a conductive film that has transparency and a large work function (for example, an indium tin oxide alloy (ITO), an indium oxide-zinc oxide alloy ($In_2O_3$—ZnO), zinc oxide (ZnO), or the like).

Insulator 1214 (referred to as a bank, or the like) is formed to cover the edge portion of the first electrode (anode) 1213. To improve coverage, the upper edge portion or the lower edge portion of the insulating substance 1214b is formed to have a curved surface having a curvature. In addition, the insulator 1214 may be covered by a protective film formed of an aluminum nitride film, an aluminum nitride oxide film, a thin film containing carbon as its main components, or a silicon nitride film.

An organic compound layer 1215 is selectively formed over the first electrode (anode) 1213 by vapor deposition using an evaporation mask or ink-jetting. Further, a second electrode (cathode) 1216 is formed over the organic compound layer 1215. As a material for forming the cathode, a small work function material (for example Al, Ag, Li, Ca, alloys thereof, that is, MgAg, MgIn, AlLi, $CaF_2$, or CaN) may be used. Thus, a light-emitting device 1218 comprising the first electrode (anode) 1213, the organic compound layer 1215, and the second electrode (cathode) 1216, is fabricated.

Figure 9A:
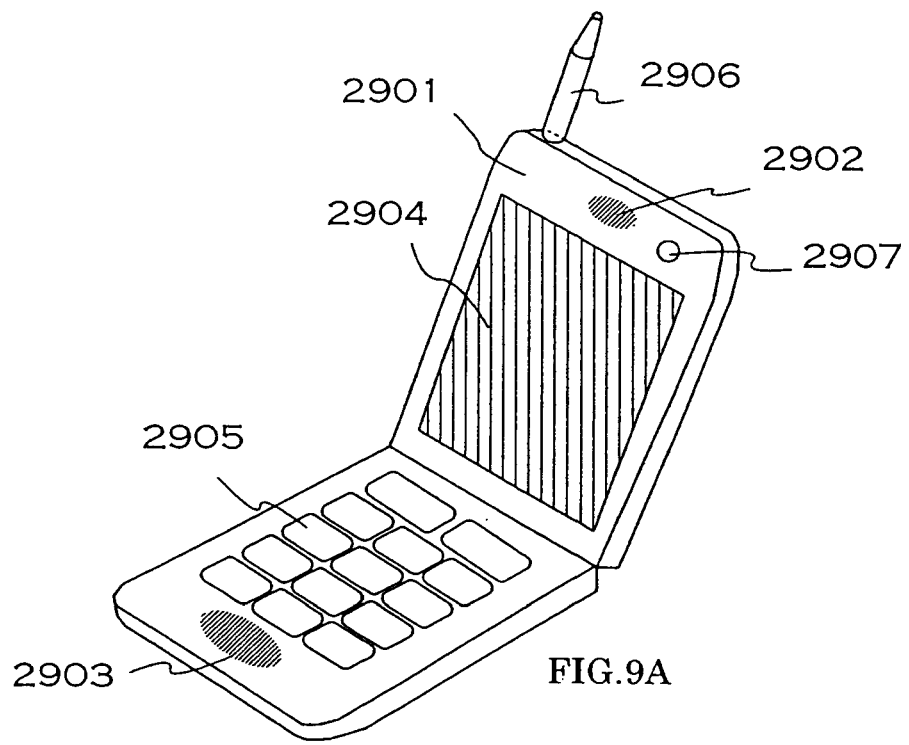
FIGS. 9A to 9C are views of examples of electric appliances according to Embodiment 5.
Figure 9B:
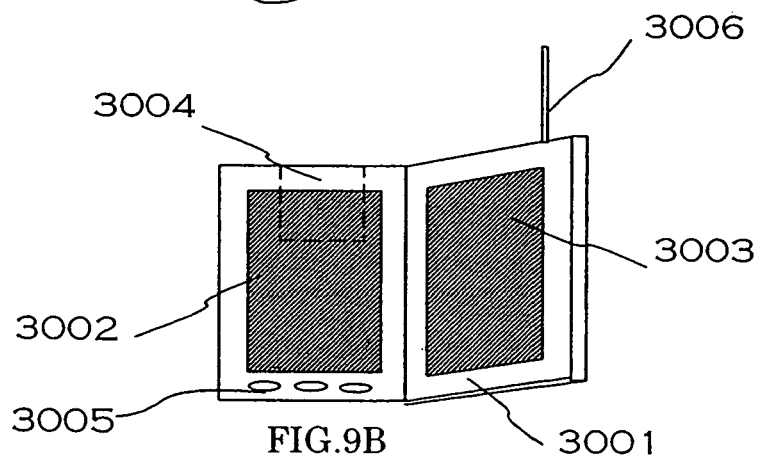

The light-emitting device 1218 emits light in the direction indicated by an arrow in FIG. 9B. The light-emitting device 1218 in this embodiment is a type of the one which can achieve monochrome emission of R, G, or B. Full color emission can be achieved by the light-emitting device in which each organic compound layer that can achieve R, G, and B emission is formed selectively.

Further, a protective layer 1217 is formed in order to seal the light-emitting device 1218. The transparent protective layer 1217 may be preferably formed of an insulating film containing silicon nitride or silicon nitride oxide as it main components, which is formed by sputtering (DC type of RF type) or PCVD, a thin film containing carbon as its main component (for example, DLC film, or CN film), or a lamination layer comprising the above. A silicon nitride film having high blocking effects against impurity elements such as moisture, alkali metals, or the like can be formed by using a silicon target under an atmosphere comprising nitrogen and argon. In addition, the transparent protective film can be formed by a film formation system that uses remote plasma.

Further, in order to seal the light-emitting device 1218, the sealing substrate 1204 is bonded to the substrate by sealing agents 1205a and 1205b under an inert gas atmosphere. A depressed portion is formed over the surface of the sealing substrate 1204 by sandblast in advance. Then, desiccant 1207 is placed to a depressed portion over the sealing substrate 1204. It is preferable to use an epoxy resin as the material for the sealing agents 1205a and 1205b. It is also preferable that sealing agents 1205a and 1205b inhibit transmission of moisture or oxygen as possible.

In addition to a plastic substrate, a glass substrate, or a quartz substrate, a plastic substrate formed of polyester, acrylic, or the like, can be used for the substrate 1210 in this embodiment.

Further, this embodiment can freely be combined with any one of Embodiment Mode 1 to Embodiment Mode 3, Embodiment 1, or Embodiment 2.

Embodiment 4

A cross-sectional structure of one pixel, especially a connection of a light-emitting device and a TFT, and a shape of a bank provided between pixels, will be described in this embodiment.

Figure 7A:
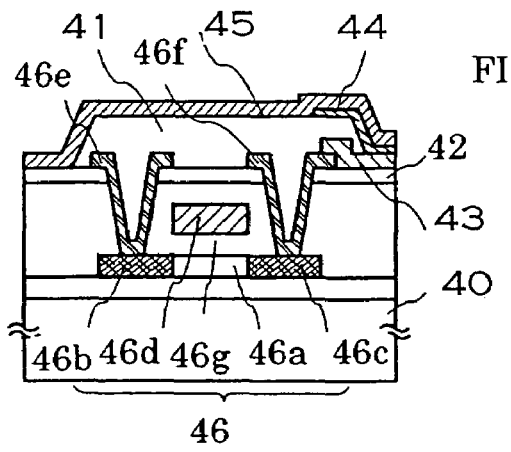
FIGS. 7A to 7F are views showing the connections of a TFT and a first electrode and a shape of a bank according to Embodiment 4.

In FIG. 7A, reference numeral 40 denotes a substrate; 41, a bank; 42, an insulating film; 43, a first electrode (anode); 44, an organic compound layer; 45, a second electrode (cathode); and 46, a TFT.

In the structure of TFT 46, reference numeral 46a denotes a channel formation region; 46b, 46c, a source region or a drain region; 46d, a gate electrode; and 46e, 46f, a source electrode or a drain electrode. A top gate TFT is illustrated here, but not exclusively, a reverse staggered TFT or a forward staggered TFT may be utilized. In addition, reference numeral 46f denotes an electrode that connects to the TFT 46 by partly overlapping with the first electrode 43.

Figure 7B:
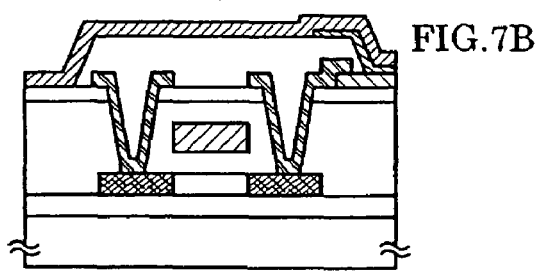

FIG. 7B is a cross-sectional view that is partly different from FIG. 7A.

In FIG. 7B, the first electrode and the source or drain electrode are formed to overlap each other in a different way from FIG. 7A. The first electrode is connected to the source or drain electrode by forming the first electrode to overlap the source or drain electrode after the patterning process.

Figure 7C:
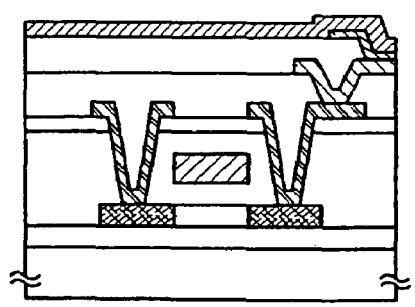
Figure 7D:
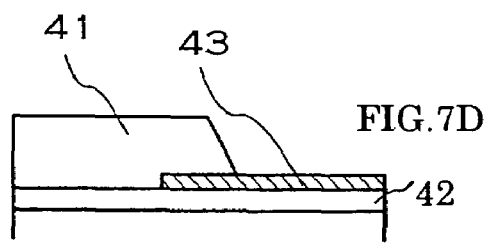

FIG. 7C is a cross-sectional view that is partly different from FIG. 7A.

In FIG. 7C, an interlayer insulating film is formed over the insulating film 42. The first electrode 42 is connected to the electrode of the TFT through a contact hole.

The bank 41 may be formed to have a tapered shape in its cross-sectional shape. The bank 41 can be formed into the tapered shape by exposing the resist by photolithography, and etching nonphotosensitive organic resin and inorganic insulating film.

Figure 7E:
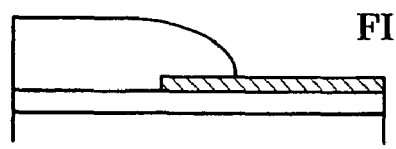

The bank 41 can be formed into the shape of having a curved upper edge portion as shown in FIG. 7E by using positive type photosensitive resin for the bank 41.

Figure 7F:
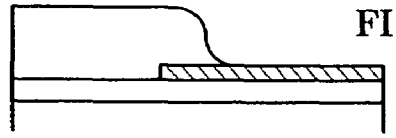

The bank 41 can be formed into the shape of having a curved upper edge portion and a curved bottom edge portion as shown in FIG. 7F by using negative type photosensitive resin for the bank 41.

This embodiment can be freely combined with any one of Embodiment Mode 1 to Embodiment Mode 3, or Embodiment 1 to Embodiment 3.

Embodiment 5

By implementing the invention, various modules (active matrix type liquid crystal module, active matrix type EL module and active matrix type EC module) can be fabricated. That is, by implementing the invention, all of the electric appliances incorporated those modules can be completed.

As such electric appliances, a video camera, a digital camera, a head mount display (goggle type display), a car navigation, a projector, a car stereo, a personal computer, a portable information terminal (a mobile computer, a cellular phone, an electronic book, or the like) or the like can be given. FIGS. 8A to 9C show examples of these.

Figure 8A:
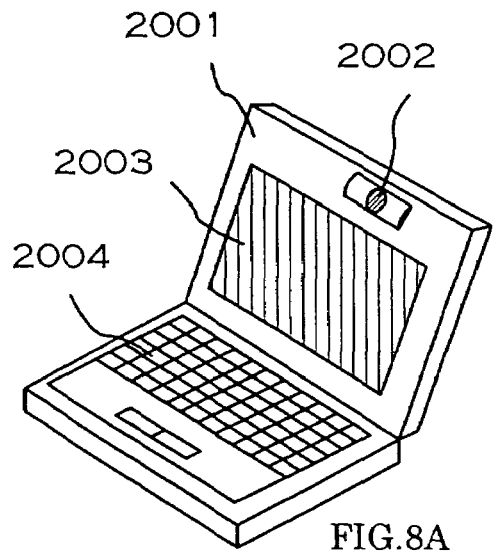
FIGS. 8A to 8E are views of examples of electric appliances according to Embodiment 5.

FIG. 8A is a personal computer which includes a main body 2001, an image input portion 2002, a display portion 2003, a keyboard 2004, or the like. The personal computer can be formed to have high reliability and to be lightweight by using a plastic substrate having thermal conductivity according to the present invention for the module.

Figure 8B:
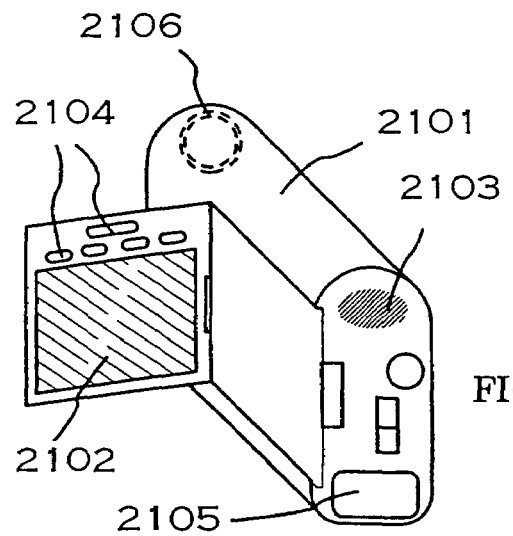

FIG. 8B is a video camera which includes a main body 2101, a display portion 2102, a voice input portion 2103, an operation switch 2104, a battery 2105, an image receiving portion 2106, or the like. The video camera can be formed to have high reliability and to be lightweight by using a plastic substrate having thermal conductivity according to the present invention for the module.

Figure 8C:
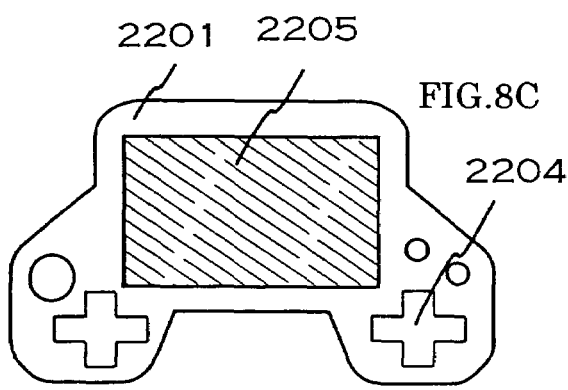

FIG. 8C is a game machine which includes a main body 2201, an operation switch 2204, a display portion 2205, or the like.

Figure 8D:
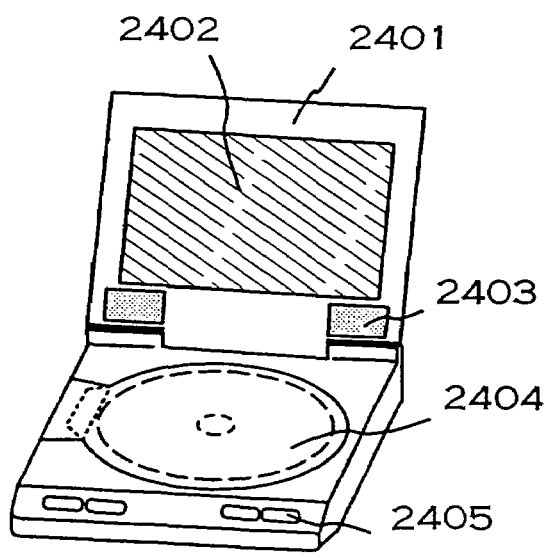

FIG. 8D is a player using a record medium recorded with programs (hereinafter, record medium) which includes a main body 2401, a display portion 2402, a speaker portion 2403, a record medium 2404, an operation switch 2405, or the like. Further, the player uses DVD (Digital Versatile Disc) or CD as a record medium and can enjoy music, enjoy movie and carry out the game or Internet.

Figure 8E:
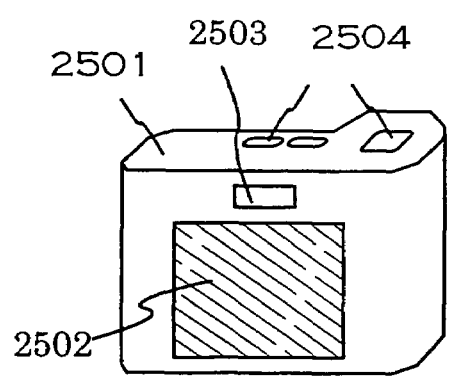

FIG. 8E is a digital camera which includes a main body 2501, a display portion 2502, an eye-piece portion 2503, an operation switch 2504, an image receiving portion (not shown), or the like. The digital camera can be formed to have high reliability and to be lightweight by using a plastic substrate having thermal conductivity according to the present invention for the module.

FIG. 9A is a cellular phone which includes a main body 2901, a voice output portion 2902, a voice input portion 2903, a display portion 2904, an operation switch 2905, an antenna 2906, an image input portion (CCD, image sensor) 2907, or the like.

FIG. 9B is a portable book (electronic book) which includes a main body 3001, display portions 3002, 3003, a record medium 3004, an operation switch 3005, an antenna 3006, or the like. The portable book can be formed to have high reliability and to be lightweight by using a plastic substrate having thermal conductivity according to the present invention for the module.

Figure 9C:
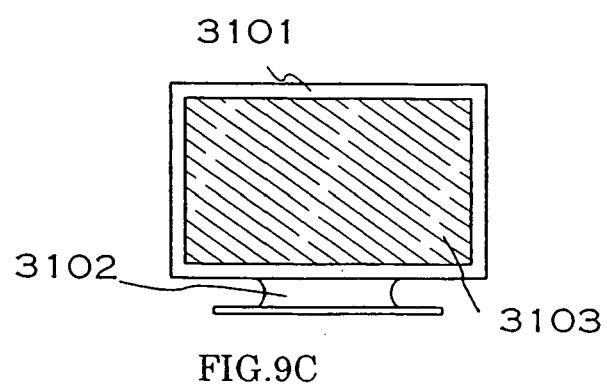

FIG. 9C is a display which includes a main body 3101, a support base 3102, a display portion 3103, or the like. The display can be formed to have high reliability and to be lightweight by using a plastic substrate having thermal conductivity according to the present invention for the module.

Incidentally, the display shown in FIG. 9C is of a screen size of middle or small type or large type, for example, a screen size of 5 to 20 inches. Further, in order to form the display portion of this size, it is preferable to use a display portion having a side of a substrate of 1 m and carry out mass production by gang printing.

As described above, the range of applying the present invention is extremely wide and is applicable to a method of fabricating electric appliances of all fields. Further, the electric appliances of the embodiment can be realized by combining with any one of Embodiment Mode 1 to Embodiment Mode 3, and Embodiment 1 to Embodiments 4.

Embodiment 6

The electric appliances represented in Embodiment 5 is installed with a module that includes a panel having a sealed light emitting device mounted with an IC including a controller and a circuit. Each of the module and the panel can be thought as one mode of the light-emitting apparatus. In the present invention, a specific configuration of the module will be described.

Figure 10A:
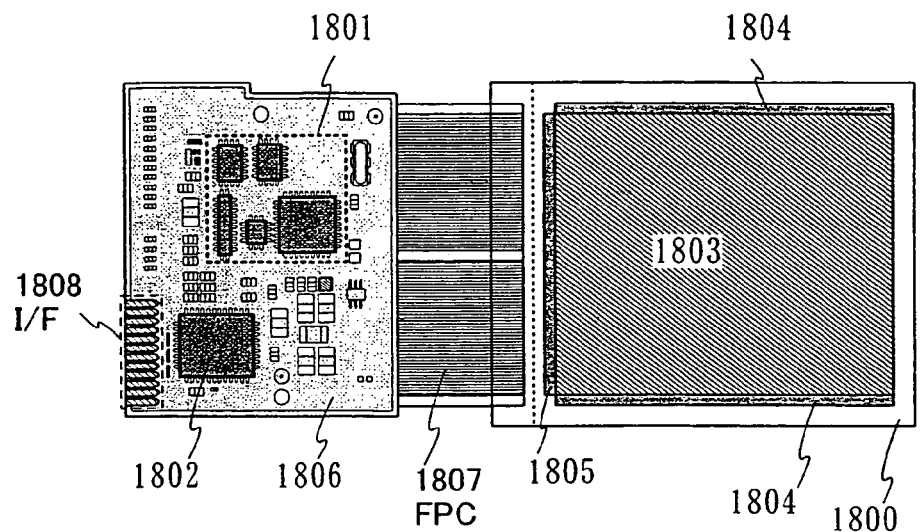
FIGS. 10A and 10B are views showing a module according to Embodiment 6.

FIG. 10A shows an appearance of a module including a panel 1800 mounted with a controller 1801 and a power supply circuit 1802. The panel 1800 is provided with a pixel portion 1803 in which a light-emitting device is provided in each pixel, a gate line driver circuit 1804 for selecting a pixel in the pixel portion 1803, and a source line driver circuit 1805 for supplying a video signal to the selected pixel.

The controller 1801 and the power supply circuit 1802 are provided in a printed substrate 1806, various kinds of signals and power supply voltage output from the controller 1801 or the power supply circuit 1802 are supplied via FPC 1807 to the pixel portion 1803, the gate line driver circuit 1804, and the source line driver circuit 1805 in the panel 1800.

The power supply voltage and the various kinds of signals are supplied to the printed circuit 1806 via an interface (I/F) 1808 in which a plurality of input terminals are arranged.

Although the printed substrate 1806 is mounted on the panel 1800 with FPC in this embodiment, the present invention is not limited to this configuration. The controller 1801 and the power supply circuit 1802 may be provided directly on the panel 1800 with COG (Chip on Glass) method.

Further, in the printed circuit 1806, there is a case that a capacitance formed between leading wirings and a resistance of a wiring itself cause a noise to a power supply voltage or a signal, or make a rise of a signal dull. Therefore, it may be provide various kinds of devices such as a capacitor and a buffer to prevent the noise to the power supply voltage or a signal and the dull rise of the signal in the printed substrate 1806.

Figure 10B:
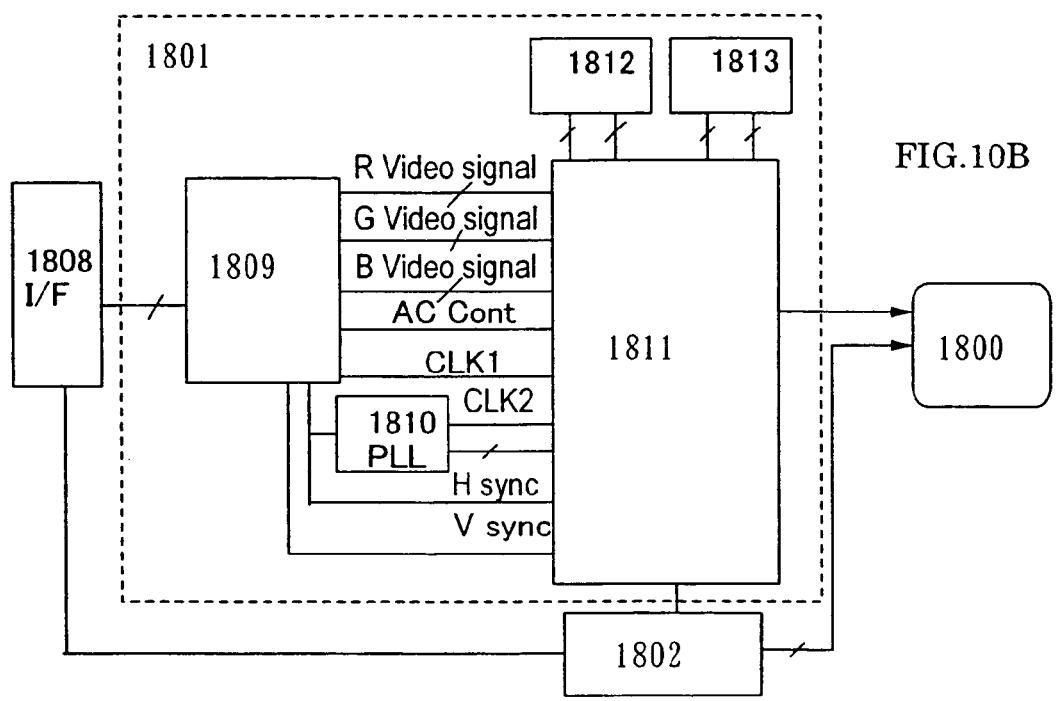

FIG. 10B is a block diagram showing the configuration of the printed substrate 1806. Various kinds of signals and power supply voltage supplied to the interface 1808 are supplied to the controller 1801 and the power supply circuit 1802.

The controller 1801 has an A/D converter 1809, a phase locked loop (PLL) 1810, a control-signal generating portion 1811, and SRAMs (Static Random Access Memory) 1812 and 1813. Although the SRAM is used in this embodiment, instead of the SRAM, SDRAM can be used and DRAM (Dynamic Random Access Memory) can also be used if it is possible to write in and read out data at high speed.

Video signals supplied via the interface 1808 are subjected to a parallel-serial conversion in the A/D converter 1809 to be input into the control-signal generating portion 1811 as video signals corresponding to respective colors of R, G, and B. Further, based on various kinds of signals supplied via the interface 1808, Hsync signal, Vsync signal, clock signal CLK, and volts alternating current (AC cont) are generated in the A/D converter 1809 to be input into the control signal generating portion 1811.

The phase-locked loop 1810 has a function to synchronize the phase of the frequency of each signal supplied through the interface 1808 with the phase of the operating frequency of the control-signal generating portion 1811. The operating frequency of the control-signal generating portion 1811 is not necessarily the same as the frequency of each signal supplied through the interface 1808, but adjust, in the phase-locked loop 1810, the operating frequency of the control-signal generating portion 1811 in a manner of synchronization with one another.

The video signal inputted to the control-signal generating portion 1811 is once written into and held on the SRAMs 1812, 1813. The control-signal generating portion 1811 reads out the video signals corresponding to all the pixels, one bit by one bit, from among all the bits of video signals held on the SRAM 1812, and supplies them to the source line driver circuit 1805 in the panel 1800.

The control-signal generating portion 1811 supplies the information concerning a period during which the light emitting device of each bit causes light emission, to the scanning-line driver circuit 1804 in the panel 1800.

The power supply circuit 1802 supplies a predetermined power supply voltage to the source line driver circuit 1805, scanning-line driver circuit 1804 and pixel portion 1803 in the panel 1800.

Figure 11:
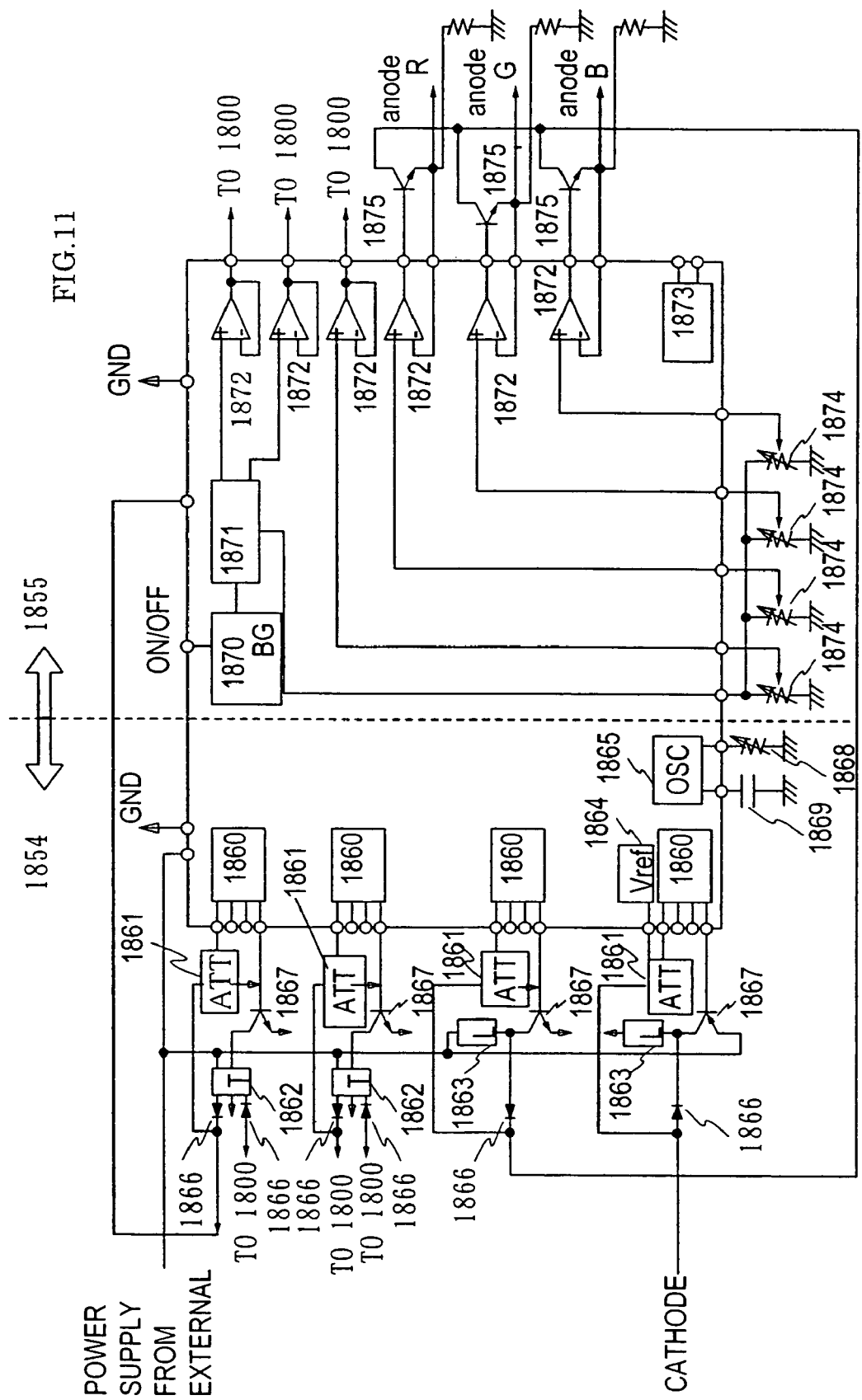
FIG. 11 is a block diagram according to Embodiment 6.

Explanation is now made on the configuration of the power supply circuit 1802 with reference to FIG. 11. The power supply circuit 1802 of this embodiment comprises a switching regulator 1854 using four switching regulator controls 1860 and a series regulator 1855.

Generally, the switching regulator, which is small in size and light in weight as compared to the series regulator, can raise voltage and invert polarities besides voltage reduction. On the other hand, the series regulator, which is used only in voltage reduction, has a well output voltage accuracy as compared to the switching regulator, hardly causing ripples or noises. The power supply circuit 1802 of this embodiment uses a combination of the both.

The switching regulator 1854 shown in FIG. 11 has a switching regulator control (SWR) 1860, an attenuator (ATT) 1861, a transformer (T) 1862, an inductor (L) 1863, a reference power supply (Vref) 1864, an oscillator circuit (OSC) 1865, a diode 1866, a bipolar transistor 1867, a varistor 1868 and a capacitance 1869.

When a voltage of an external Li-ion battery (3.6 V) or the like is transformed in the switching regulator 1854, a power supply voltage to be supplied to a cathode and a power supply voltage to be supplied to the switching regulator 1854 are generated.

The series regulator 1855 has a band-gap circuit (BG) 1870, an amplifier 1871, operational amplifiers 1872, a current source 1873, a varistor 1874, and a bipolar transistor 1875, and is supplied with a power supply voltage generated at the switching regulator 1854.

In the series regulator 1855, a power supply voltage generated by the switching regulator 1854 is used to generate a direct current power supply voltage to be supplied to a wiring (current supply line) for supplying current to the anodes of various-color of light emitting devices according to a constant voltage generated by the band-gap circuit 1870.

Incidentally, the current source 1873 is used for a drive method to write video signal current to a pixel. In this case, the current generated by the current source 1873 is supplied to the source line driver circuit 1805 in the panel 1800. In the case of a drive method to write the video signal voltage to a pixel, the current source 1873 need not necessarily be provided.

A switching regulator, an OSC, an amplifier and an operation amplifier can be formed using TFT.

The structure of this embodiment may be freely combined with any of Embodiment Mode 1 to 3 and Embodiment 1 to 5.

Embodiment 7

An example of a fabricating method for a passive matrix light-emitting apparatus (also referred to as a simple matrix light-emitting apparatus) will be described in this embodiment.

A metal film (typically, a tungsten film) is formed over a glass substrate, and an oxide layer (typically, an oxide silicon film) is formed over the metal film, then, plural first wirings are formed into striped form over the oxide layer using a material such as ITO (a material to be an anode). Next, a bank formed of resist or photosensitive resin is formed so as to encircle a region to be a light-emitting region. Then, a layer containing an organic compound is fabricated in the region that is encircled by the bank by vapor deposition or ink-jetting. In the case of achieving a full color display, a layer containing an organic compound is fabricated by selecting appropriately materials. Striped plural second wirings are formed of a metal material such as Al or an alloy of Al (a material to be a cathode) over the bank and the layer containing an organic compound so as to intersect with the plural first wirings formed of ITO. According to above-described processes, a light-emitting device using a layer containing an organic compound as a light-emitting layer can be fabricated.

Then, a sealing substrate is bonded to the glass substrate, or a protective film is formed over the second wiring so as to seal the light-emitting device. As suitable materials for a sealing substrate, mixture of a low-melting metal (lead-free solders such as tin, bismuth, and zinc); ceramics such as boron nitride, aluminum nitride, magnesium oxide, beryllium nitride, or the like; and synthetic-resin composed of polypropylene, polypropylene sulfide, polycarbonate, polyetherimide, polyphenylene sulfide, polyphenylene oxide, polysulfone, or polyphthalamide having high thermal conductivity ranging from 2 to 30 W/mK is useful.

Then, a glass substrate is peeled-off. The internal or the interface of the oxide layer can be peeled-off by a physical means. Thereafter, a plastic substrate that is transparent to light is bonded thereto with an adhesive.

Figures 12A, 12B:
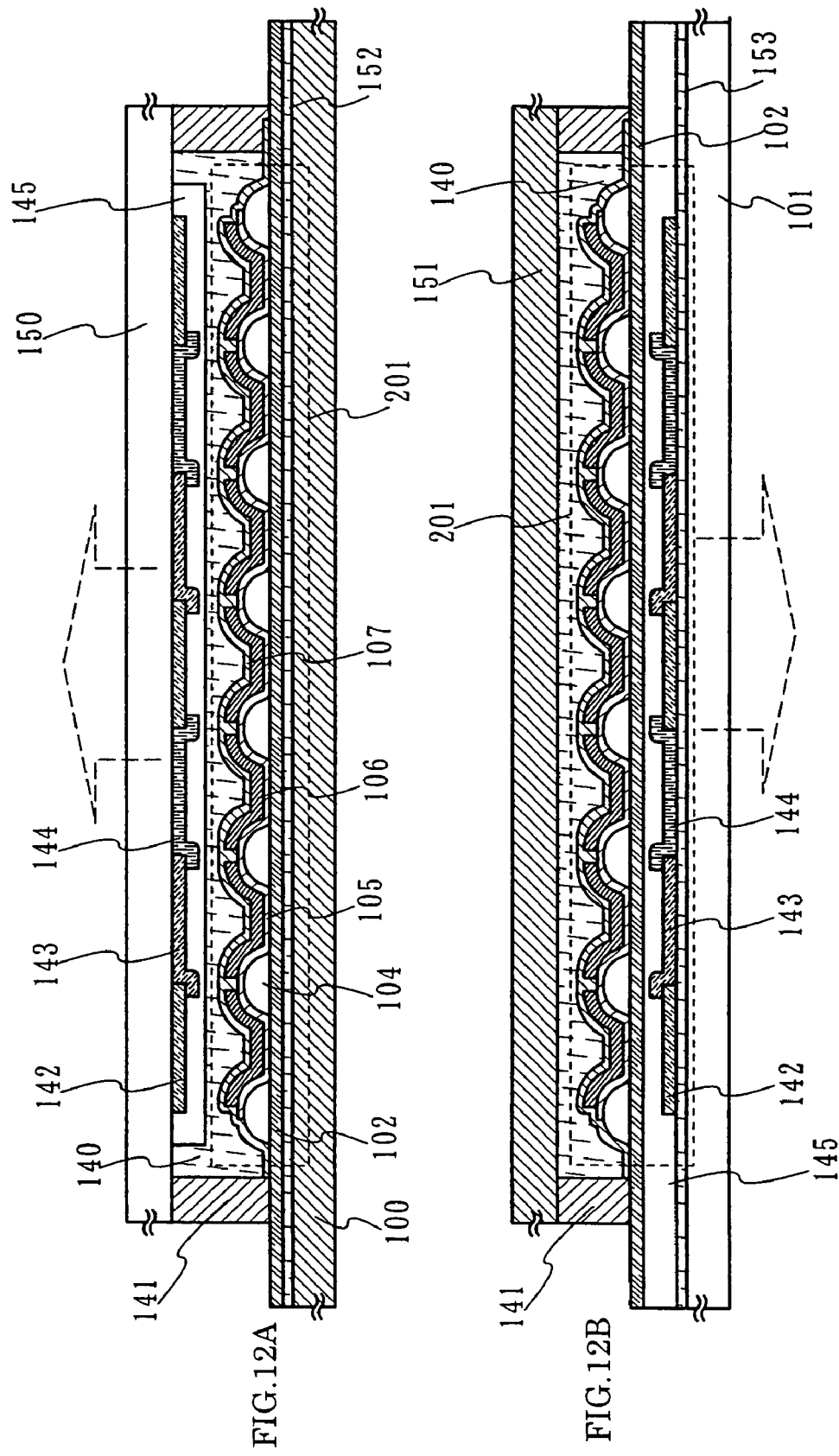
FIGS. 12A and 12B are views showing a passive light-emitting apparatus according to Embodiment 7.

FIG. 12A is a view showing the example of a cross-sectional structure of a display device according to the present invention.

The pixel portion 201 is provided in which a first electrode and a second electrode are formed to intersect each other via an adhesive 152 over the main surface of a plastic substrate 100 having high thermal conductivity, and a light-emitting device is fabricated over the intersection of the first and second electrodes. That is, the pixel portion 201 comprising luminescent pixels formed in a matrix configuration is formed. The number of pixels are 640×480 dots in the case of VGA, 1024×768 dots in the case of XGA, 1365×1024 dots in the case of SXGA, and 1600×1200 dots in the case of UXGA. The number of the first electrode and the second electrode is determined depending on the number of the pixels. Moreover, an input terminal portion provided with a terminal pad for connecting with an external circuit is formed at the edge portion of the substrate 101, the periphery portion of the pixel portion 201.

In the display device shown in FIG. 12A, the pixel portion in which the first electrode 102 that extends in the directions of both right and left is formed on the main surface of the substrate 100 via the adhesive 152, and a thin film 105 including a luminous body (hereinafter referred to as an EL layer as a matter of convenience since the thin film includes medium that exhibits electroluminescence) is formed thereon, then, the second electrode 106 that extends in the directions of both top and bottom is formed thereon, and then, a pixel is formed over the intersection of the first and second electrodes is formed. That is, pixels are arranged in a matrix configuration by forming the first electrode 102 and second electrode 106 in the lengthwise and breadthwise. The input terminal is formed of the same material as that for forming the first electrode and the second electrode. The number of the input terminals is the same as that of the first electrodes and the second electrodes arranged in the lengthwise and breadthwise.

As seen from the cross-sectional form of the bank 104, areas from the bottom end portion, which is in contact with the first electrode, to the top end portion has a curved surface. The curved surface form of the bank 104 has at least one radius of curvature having a center of the curvature in the bank or at the bottom end portion of the bank. Or the curved bottom end portion, which is in contact with the first electrode 102, of the bank 104 has at least one first radius of curvature having a center of the curvature at the outside of the bank 104, and the curved upper end portion of the bank 104 has at least one second radius of curvature having a center of the curvature in the bank or at the bottom end portion side. The cross-sectional form of the bank 104 may have a continuous variable radius of curvature at the areas from the bottom end portion to the upper end portion. An EL layer is formed along the curved surface form. The curved surface form makes the stress of the EL layer relax. That is, the curved surface form is possible to reduce the distortion due to the thermal stress of a light emitting device formed of a stacked layer of different materials.

A opposing substrate 150 for sealing a pixel portion 201 is firmly fixed with a sealing agent 141. The space between the substrate 101 and the opposing substrate 150 may be filled with inert gas or sealed an organic resin material 140 therein. In any event, a light-emitting device in the pixel portion 201 can prevent its deterioration due to extrinsic impurities without providing drying agent since the light-emitting device is coated with a barrier insulating film 107.

As shown in FIG. 12A, coloring layers 142 to 144 are formed at the side of the opposing substrate 150 corresponding to each pixel of the pixel portion 201. A flattening layer 145 can prevent unevenness due to the coloring layers. FIG. 12B is a view showing a structure in which the coloring layers are formed at the side of the substrate 101, and the first electrode 102 is formed over the flattening layer 145. The substrate 101 is bonded to the flattening layer 145 with an adhesive 153. The opposing substrate 151 has high thermal conductivity. The light emitting direction in the structure shown in FIG. 12B is different from that shown in FIG. 12B. In FIG. 12A, like components are denoted by like numerals as of FIG. 12B.

The present invention can be applied not only to a full color display device but also a surface luminous, electric spectaculars device, or the like.

This embodiment can be freely applied to any one of Embodiment Modes 1 to 3, or Embodiment 5.

According to the present invention, heat generated from a device is radiated through a plastic substrate having a high thermal conductivity to increase life of the device and to improve reliability of a semiconductor device.

Further, the plastic substrate having a high thermal conductivity is inexpensive and flexible and light-weight as compared with a metal substrate.

What is claimed is:

1. A semiconductor apparatus comprising:
a plastic substrate or a plastic base material each of which has thermal conductivity of from 2 to 30 W/mK as a support medium;
an adhesive in contact with the plastic substrate or the plastic base material;
an insulating film in contact with the adhesive; and
a device over the insulating film,
wherein the plastic substrate or the plastic base material comprises a resin and a metal fiber provided in the resin.

2. An apparatus according to claim 1, wherein the device is a thin-film transistor, a light-emitting device including a light-emitting layer containing an organic compound, a liquid crystal device, a memory device, a pin-junction silicon photoelectric converter, or a silicon resistance element.

3. An apparatus according to claim 1, wherein the adhesive has thermal conductivity.

4. An apparatus according to claim 1, wherein each the plastic substrate or the plastic base material has higher thermal conductivity than that of the adhesive.

5. An apparatus according to claim 1, wherein the plastic substrate or the plastic base material each of which has thermal conductivity is formed of a mixture of low-melting metals, ceramics, and synthetic resin, the synthetic resin comprising a material selected from the group consisting of polypropylene, polypropylene sulfide, polycarbonate, polyetherimide, polyphenylene sulfide, polyphenylene oxide, polysulfone, and polyphthalamide.

6. An apparatus according to claim 1, wherein the adhesive contains powder or filler comprising a material selected from the group consisting of silver, nickel, aluminum, and aluminum nitride.

7. An apparatus according to claim 1, wherein the semiconductor apparatus is incorporated into one selected from the group consisting of a video camera, a digital camera, a goggle type display, a car navigation, a personal computer, and a portable information terminal.

8. A semiconductor apparatus comprising:
a plastic substrate or a plastic base material each of which has thermal conductivity of from 2 to 30 W/mK as a support medium;
an adhesive in contact with the plastic substrate or the plastic base material;
an insulating film in contact with the adhesive;
a cathode and an anode provided over the insulating film; and
a film containing an organic compound provided between the cathode and the anode.

9. An apparatus according to claim 8, wherein the adhesive has thermal conductivity.

10. An apparatus according to claim 8, wherein each the plastic substrate or the plastic base material has higher thermal conductivity than that of the adhesive.

11. An apparatus according to claim 8, wherein the plastic substrate or the plastic base material each of which has thermal conductivity is formed of a mixture of low-melting metals, ceramics, and synthetic resin, the synthetic resin comprising a material selected from the group consisting of polypropylene, polypropylene sulfide, polycarbonate, polyetherimide, polyphenylene sulfide, polyphenylene oxide, polysulfone, and polyphthalamide.

12. An apparatus according to claim 8, wherein the adhesive contains powder or filler comprising a material selected from the group consisting of silver, nickel, aluminum, and aluminum nitride.

13. An apparatus according to claim 8, wherein the semiconductor apparatus is incorporated into one selected from the group consisting of a video camera, a digital camera, a goggle type display, a car navigation, a personal computer, and a portable information terminal.

14. An apparatus according to claim 8 wherein the film containing the organic compound comprises a light-emitting layer.

15. A semiconductor apparatus comprising:
    a plastic substrate or a plastic base material each of which has thermal conductivity of from 2 to 30 W/mK as a support medium;
    an adhesive in contact with the plastic substrate or the plastic base material;
    an insulating film in contact with the adhesive; and
    a device over the insulating film.

16. An apparatus according to claim 15, wherein the device is a thin-film transistor, a light-emitting device including a light-emitting layer containing an organic compound, a liquid crystal device, a memory device, a pin-junction silicon photoelectric converter, or a silicon resistance element.

17. An apparatus according to claim 15, wherein the adhesive has thermal conductivity.

18. An apparatus according to claim 15, wherein each the plastic substrate or the plastic base material has higher thermal conductivity than that of the adhesive.

19. An apparatus according to claim 15, wherein the plastic substrate or the plastic base material each of which has thermal conductivity is formed of a mixture of low-melting metals, ceramics, and synthetic resin, the synthetic resin comprising a material selected from the group consisting of polypropylene, polypropylene sulfide, polycarbonate, polyetherimide, polyphenylene sulfide, polyphenylene oxide, polysulfone, and polyphthalamide.

20. An apparatus according to claim 15, wherein the adhesive contains powder or filler comprising a material selected from the group consisting of silver, nickel, aluminum, and aluminum nitride.

21. An apparatus according to claim 15, wherein the semiconductor apparatus is incorporated into one selected from the group consisting of a video camera, a digital camera, a goggle type display, a car navigation, a personal computer, and a portable information terminal.

\* \* \* \* \*